(12) United States Patent
Hirano

(10) Patent No.: US 7,161,650 B2
(45) Date of Patent: Jan. 9, 2007

(54) ELECTRO-OPTIC DEVICE WITH FOLDED INTERFACE SUBSTRATE HAVING FOLDED PROJECTIONS WITH ELECTRONIC PARTS

(75) Inventor: Yoshihisa Hirano, Matsumoto (JP)

(73) Assignee: Seiko Epson Corporation (JP)

( * ) Notice: Subject to any disclaimer, the term of this patent is extended or adjusted under 35 U.S.C. 154(b) by 155 days.

(21) Appl. No.: 10/875,084

(22) Filed: Jun. 23, 2004

(65) Prior Publication Data

US 2005/0018102 A1    Jan. 27, 2005

(30) Foreign Application Priority Data

Jun. 24, 2003  (JP) .............................. 2003-179591

(51) Int. Cl.
    *G02F 1/15*   (2006.01)
(52) U.S. Cl. .................... 349/150; 439/239; 349/58
(58) Field of Classification Search ................ 349/150, 349/110, 58; 345/102; 248/916
    See application file for complete search history.

(56) References Cited

U.S. PATENT DOCUMENTS 6,806,920 B1 * 10/2004 Hayashi et al. ............... 349/58

2003/0067577 A1 * 4/2003 Yamada ....................... 349/150
2003/0117543 A1 * 6/2003 Chang ........................... 349/58

FOREIGN PATENT DOCUMENTS

JP      2000-276068       10/2000

* cited by examiner

*Primary Examiner*—Andrew Schechter
*Assistant Examiner*—Phu Vu
(74) *Attorney, Agent, or Firm*—Harness, Dickey & Pierce, P.L.C.

(57) ABSTRACT

An electrooptic device is provided that comprises an electrooptic panel having an image display region for displaying an image and an interface substrate connected to the electrooptic panel via a connection part. The interface substrate has a folding part folded at the connection part toward a lower-surface side of the electrooptic panel and projections extending from the folding part positioned at the lower-surface side of the electrooptic panel. The projections are folded toward a top-surface side of the electrooptic panel so that electronic parts of the projections are opposed to driver ICs that are mounted on an overhanging part of the electrooptic panel.

16 Claims, 15 Drawing Sheets

Fig. 3a
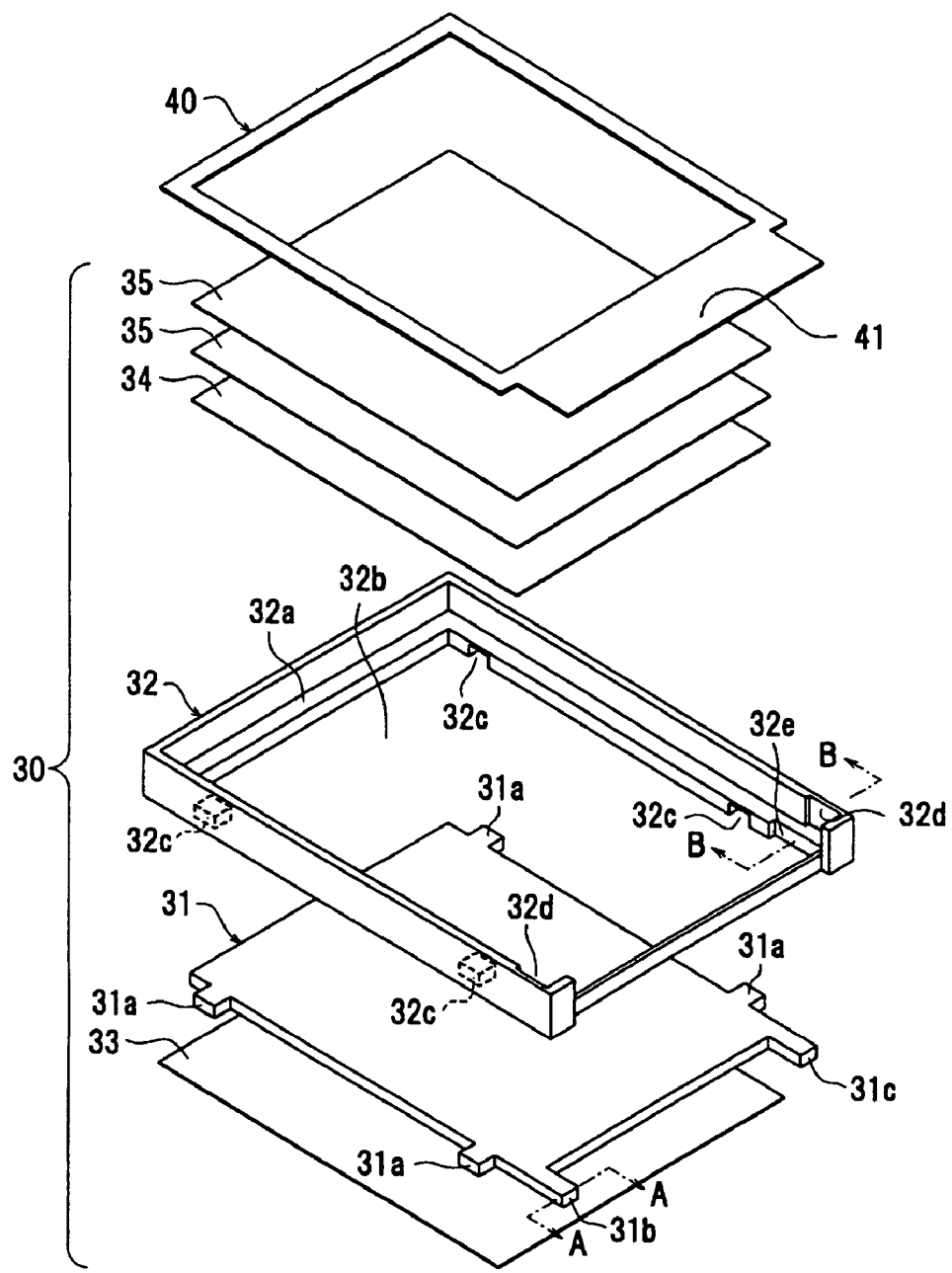
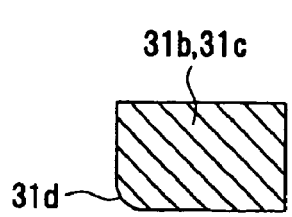
Fig. 3b
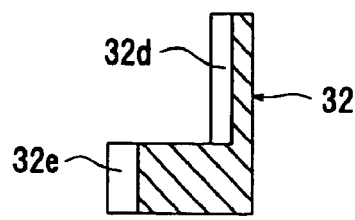
Fig. 3c

ELECTRO-OPTIC DEVICE WITH FOLDED INTERFACE SUBSTRATE HAVING FOLDED PROJECTIONS WITH ELECTRONIC PARTS

RELATED APPLICATIONS

This application claims priority to Japanese Patent Application No. 2003-179591 filed Jun. 24, 2003 which is hereby expressly incorporated by reference herein in its entirety.

BACKGROUND

1. Technical Field of the Invention

The present invention relates to an electrooptic device, a method for manufacturing the same, and an electronic apparatus. More specifically, the present invention relates to an electrooptic device having electronic parts mounted on an interface substrate, the electronic parts being provided so as to face the top surface or lower surface of an electrooptic panel, a manufacturing method, and an electronic apparatus.

2. Related Art

A conventional electrooptic device such as a liquid-crystal display device comprises an electrooptic panel having an image display region including a plurality of pixels formed by a liquid crystal or the like, a driver circuit including a plurality of electronic parts required for driving the image display region, an interface substrate for connecting the electrooptic panel to an electronic apparatus such as a mobile phone, a light source for applying light to a light guide plate, and the light guide plate for emitting the light applied from the light source to the image display region. A backlight functioning as the light source is mounted on the interface substrate and provided in a case in which the electrooptic device is housed. The backlight applies light onto the light guide plate housed in the case, and the light guide plate emits light to the image display region of the electrooptic panel. Hitherto, hard substrates such as glass substrates have been used, as the interface substrate. Recently, however, flexible substrates that can be easily deformed and that have high versatility of design, such as FPCs (Flexible Printed Circuits), heat seals, and so forth, have been used.

The plurality of electronic parts forming the driver circuit includes a driver IC for supplying a driving voltage, a power-supply IC for supplying a voltage to the driver IC or the like, a control IC for controlling the driver IC and the power-supply IC. Of these electronic parts, the driver IC is mounted on the electrooptic panel and the other electronic parts (the power-supply IC, the control IC, and so forth) are mounted on the interface substrate. The other electronic parts are mounted near the light source mounted on the interface substrate.

However, the part on which the light source of the interface substrate is to be mounted is a limited space formed by the case and the light guide plate. Therefore, it is difficult to mount the above-described and the other electronic parts on this space. Conventionally, therefore, other electronic parts are mounted on a part of the interface substrate, where the part extends outside the electrooptic device. Therefore, the electrooptic device cannot be downsized. In the past, therefore, a technique for mounting the electronic parts such as the power IC and the control IC on the driver IC was proposed, where the driver IC is directly mounted on an overhanging part provided on the electrooptic panel including a pair of substrates that are opposed to each other.

According to this technique, a control-circuit substrate with the power-supply IC, the control IC, and so forth, that are mounted thereon is placed on the driver IC. Further, the control-circuit substrate and the driver IC are electrically connected to each other. However, according to the above-described known technique, the control-circuit substrate needs to be manufactured for each electrooptic panel with a different number of pixels or driver ICs mounted on overhanging parts at different positions. As a result, the number of procedures and the cost for manufacturing the electrooptic device increase. Further, the control-circuit substrate and the driver IC, or the electrooptic panel are connected by a number of wirings. In particular, where a plurality of the driver ICs are provided and electrically connected to the control-circuit substrate at one position, the area of the overhanging part with the driver ICs mounted thereon may increase, allowing for spaces among the wiring. As a result, the area of the control-circuit substrate may increase. Since the dimensions of the electrooptic device may increase, it may be difficult to downsize the entire electrooptic device. Further, since the control-circuit substrate is electrically connected only to the driver ICs, electronic parts other than those forming the driver circuit cannot be mounted on the control-circuit substrate.

Accordingly, an object of the present invention is to provide an electrooptic device that can be downsized and manufactured by reduced procedures and cost, a method for manufacturing the same, and an electronic apparatus.

SUMMARY

For achieving the above-described object, an electrooptic device according to one aspect comprises an electrooptic panel having an image display region for displaying an image and an interface substrate connected to the electrooptic panel via a connection part. The interface substrate has a folding part folded at the connection part toward a lower-surface side of the electrooptic panel and projections extending from the folding part positioned at the lower-surface side of the electrooptic panel. The projections are folded toward a top-surface side of the electrooptic panel so that electronic parts of the projections are opposed to the top surface of the electrooptic panel.

An electrooptic device according to another aspect comprises an electrooptic panel having an image display region for displaying an image and an interface substrate connected to the electrooptic panel via a connection part. The interface substrate has a folding part folded at the connection part toward a lower-surface side of the electrooptic panel and projections extending from the folding part positioned at the lower-surface side of the electrooptic panel. The projections are folded toward the lower-surface side of the electrooptic panel so that electronic parts of the projections are opposed to the lower surface of the electrooptic panel.

According to the above-described aspects, connection between the interface substrate and the electrooptic panel is achieved by using the connection part of the interface substrate, and the electronic parts are provided on the projections that are folded toward the top-surface side or lower-surface side of the electrooptic panel, whereby the electronic parts are opposed to the top surface or lower surface of the electrooptic panel. As a result, since the interface substrate does not need to be connected to the electrooptic panel, the projections may have any dimensions so long as the electronic parts can be mounted thereon. Therefore, the dimensions of the electrooptic device including the electrooptic panel and the interface substrate do not increase. Further, where the electronic parts of the projections are opposed to the top surface or lower surface of the electrooptic panel, or particularly where the electrooptic panel includes a pair of substrates and the electronic parts are opposed to an overhanging part provided between the substrates, the plurality of electronic parts can be provided on the top surface or lower surface of the electrooptic panel without increasing the thickness of the electrooptic device. Accordingly, the electrooptic device can be downsized. Further, where the connection part of the interface substrate can be connected to the electrooptic panel, the use of the single interface substrate is adequate, even though the pixel number and the positions of the mounted driver ICs are changed. As a result, it becomes unnecessary to manufacture the interface substrate for each electrooptic panel with different shapes (the pixel number and the position of the mounted driver ICs). As a result, the number of procedures and cost for manufacturing the electrooptic device are prevented from being increased.

Here, the electronic parts include not only electronic parts forming the driver circuit for driving the image display region of the electrooptic panel, that is, a driver IC for supplying a driving voltage to the image display region, a power-supply IC for supplying a voltage to the driver IC or the like, a control IC for controlling the driver IC and the power-supply IC, and so forth, but also other electronic parts. For example, where an LED functioning as a light source is mounted on the interface substrate, the other electronic parts include an electronic part for driving this LED and an electronic part required for an electronic apparatus having an electrooptic device including the interface substrate. Further, the electrooptic panel is formed as a hard substrate such as a glass substrate, or a flexible substrate such as an FPC (Flexible Printed Circuit) or a heat seal. The interface substrate is formed as the flexible substrate such as the FPC or the heat seal. Further, any light source can be used as the light source so long as it can be mounted on the interface substrate. Therefore, the light source includes the LED or an electro-luminescence device.

In an electrooptic device according to another aspect, the electrooptic panel has a driver IC mounted thereon for controlling image display of the image display region, and the projections are provided so as to face the driver IC.

According to this aspect, the electronic parts of the projections are opposed to the driver IC mounted on the electrooptic panel, whereby the electronic parts can be provided on the driver IC mounted on the electrooptic panel without increasing the thickness of the electrooptic device.

In an electrooptic device according to another aspect, the projections are provided on both sides of the interface substrate. According to this aspect, the plurality of projections is formed on the interface substrate so that the electronic parts are opposed to the top surface of the electrooptic panel. Therefore, compared to the case where the plurality of electronic parts is mounted on one projection, the number of wirings of the electronic parts formed on one of the projections becomes smaller, whereby the widths and dimensions of the projections can be reduced. As a result, it becomes possible to prevent the dimensions of the projections from being increased so as to become larger than those of the surface of the electrooptic panel. Particularly where the electrooptic panel is formed by the pair of substrates, the dimensions of the projections are prevented from being increased so as to become longer than those of the overhanging part provided between the pair of substrates. Therefore, the electrooptic device can further be downsized.

In an electrooptic device according to another aspect, the electronic parts include a power-supply IC for applying power at least to the image display region of the electrooptic panel. According to this aspect, the power-supply IC is mounted on the projection parts other than heat generation part of the interface substrate, such as a part on which the LED functioning as the light source is mounted. Therefore, it becomes possible to reduce malfunctions caused by heat in the power-supply IC including a temperature compensation circuit and irregular display of the image display region.

In an electrooptic device according to another aspect, the electronic parts are covered by an insulator layer. According to this aspect, the insulator layer is provided between the electronic parts of the projections and wiring formed on the top surface of the electrooptic panel, or the driver IC mounted thereon. As a result, it becomes possible to prevent the electronic parts of the projections from being electrically contacted with the wiring formed on the top surface of the electrooptic panel or the driver IC.

As a result, it becomes possible to further prevent irregular display of the image display region caused by shorting of the electronic parts of the projections, the wiring on the top surface of the electrooptic panel, and the driver IC.

In an electrooptic device according to another aspect, the electrooptic panel includes a pair of substrates with different dimensions and has an overhanging part formed by the pair of substrates, and the projections are provided so as to face the overhanging part. According to this aspect, the electronic parts of the projections are opposed to the overhanging part of the electrooptic panel, whereby the plurality of electronic parts can be provided on the top surface of the electrooptic panel without increasing the thickness of the electrooptic device.

As a result, the electrooptic device can be downsized.

In an electrooptic device according to another aspect, the driver IC is mounted on the overhanging part of the electrooptic panel, and the projections are fixed by fixing means so that a gap is provided between the electronic parts and the driver IC. According to this aspect, it becomes possible to prevent the electronic parts from being directly contacted with the driver IC by the gap formed between the electronic parts and the driver IC. As a result, irregular display of the image display region caused by shorting of the electronic parts or the driver IC can be reduced.

In an electrooptic device according to another aspect, the fixing means is a double-sided tape having an insulation characteristic and provided between opposing surfaces of the projections and the overhanging part. According to this aspect, the projections and the overhanging part are fixed to each other by using a double-sided tape with a predetermined height (thickness). Therefore, it becomes possible to form a gap with a predetermined height between the electronic parts and the driver IC by adjusting the height of the double-sided tape. As a result, the gap can be easily formed between the electronic parts and the driver IC, and positioning of the projections with reference to the overhanging part can be easily performed. Further, since the double-sided tape has the insulation characteristic, the wiring of the electronic parts or the like formed on the projections and that of the driver IC formed on the top surface of the electrooptic panel are not electrically contacted with each other. As a result, it becomes possible to reduce irregular display of the image display region caused by shorting of the wiring formed on the projections and the wiring formed on the top surface of the electrooptic panel.

In an electrooptic device according to another aspect, the fixing means is an adhesive having an insulation characteristic for fixing the electronic parts to the driver IC. According to this aspect, a gap is provided between the electronic parts and the driver IC by the adhesive having the insulation characteristic. Since the adhesive having the insulation characteristic exists between the electronic parts and the driver IC, the electronic parts are prevented from being directly contacted with the driver IC. As a result, it becomes possible to reduce irregular display of the image display region caused by shorting of the electronic parts, or the driver IC.

An electrooptic device according to another aspect further comprises a case having a housing for housing the electrooptic panel. A cutout part, where part of the projection folded toward the top-surface side of the electrooptic panel is placed, is provided on an inner-peripheral surface of the case. According to this aspect, each of the projections is inserted into the cutout part provided in the inner-peripheral surface of the case and folded toward the top-surface side of the electrooptic panel. As a result, the protrusions do not protrude outside the outer-peripheral surface of the case, whereby the electrooptic device can further be downsized. Further, it becomes possible to prevent the projections from being damaged and prevent the wiring thereof from being shorted out when the electrooptic panel is housed in the case, for example. As a result, irregular display of the image display region caused by shorting of the wiring of the projections can further be reduced.

An electrooptic device according to another aspect further comprises a light source provided on one of surfaces of the interface substrate and a light guide plate that is housed in the case and that receives light applied from the light source and emits the applied light onto the image display region. One end of a side face of the light guide plate has a curved face, where the one end is opposed to the cutout part. According to this aspect, the end of a side of the light guide plate, where the end is opposed to the cutout part where a folding part used for folding the protrusions toward the top-surface side of the electrooptic panel is placed, has the curved face. Therefore, since the folding part of the projection is folded along the curved face, the folding part of the projection is prevented from being bulged outward from the lower surface of the case. As a result, since the projections do not protrude outward from the lower surface of the case, the electrooptic device can further be downsized.

An electrooptic device according to another aspect further comprises a case having a housing for housing the electrooptic panel. A cutout part, where part of the projection folded toward the top-surface side of the electrooptic panel is placed, is provided on an outer-peripheral surface of the case. According to this aspect, the projection is inserted into the cutout part provided in the outer-peripheral surface of the case and folded toward the top-surface side of the electrooptic panel. As a result, the protrusions do not protrude from the outer-peripheral surface of the case, whereby the electrooptic device can further be downsized. Further, both ends of the cutout part of the case, where the folding part used for folding the projection toward the top-surface side of the electrooptic panel is placed at the cutout part, may preferably have a curved face. Since the folding part of the projection is folded along the curved face, the folding part of the projection is prevented from being bulged outward from the top surface or lower surface of the case.

Further, an electronic apparatus according to another aspect has the electrooptic device according to the present aspect, whereby the electrooptic device can be downsized. Therefore, the electronic apparatus can be downsized.

A method for manufacturing an electrooptic device according to another aspect comprises the steps of connecting an electrooptic panel having an image display region for displaying an image to a connection part of an interface substrate, folding a folding part of the interface substrate at the connection part toward a lower-surface side of the electrooptic panel, and folding projections extending from the folding part of the interface substrate toward a top-surface side of the electrooptic panel, so that electronic parts of the projections are opposed to the top surface of the electrooptic panel.

According to this aspect, connection between the interface substrate and the electrooptic panel is achieved by using the connection part of the interface substrate, and the electronic parts are provided on the projections that are folded toward the top-surface side of the electrooptic panel, whereby the electronic parts are opposed to the top surface of the electrooptic panel. As a result, since there is no need to use the projections for connecting the interface substrate to the electrooptic panel, the projections may have any dimensions so long as the electronic parts can be mounted thereon. Therefore, the dimensions of the electrooptic device do not increase. Further, where the electronic parts of the projections are opposed to the top surface of the electrooptic panel, or particularly where the electrooptic panel includes a pair of substrates and the electronic parts are opposed to an overhanging part provided between the substrates, the plurality of electronic parts can be provided on the top surface of the electrooptic panel without increasing the thickness of the electrooptic device.

Accordingly, the electrooptic device can be downsized. Further, where the connection part of the interface substrate can be connected to the electrooptic panel, the use of the single interface substrate is adequate, even though the pixel number and the positions of the driver ICs mounted on the overhanging part are changed. As a result, it becomes unnecessary to manufacture the interface substrate for each of electrooptic panels with different shapes (the pixel number and the position of the mounted driver ICs). As a result, the number of procedures and cost for manufacturing the electrooptic device are prevented from being increased.

A method for manufacturing an electrooptic device according to another aspect comprises the steps of connecting an electrooptic panel having an image display region for displaying an image to a connection part of an interface substrate having a light source mounted thereon, housing a light guide plate in a case, inserting a projection extending from a folding part of the interface substrate between a cutout part provided on an inner-peripheral surface of the case and the light guide plate, fixing the interface substrate to the light guide plate so that light emitted from the light source is incident on the light guide plate, housing the electrooptic panel in a housing formed in the case by folding the electrooptic panel at the folding part, folding the projection toward a top-surface side of the electrooptic panel, and providing electronic parts of the projection, so as to be opposed to the top surface of the electrooptic panel.

According to this aspect, connection between the interface substrate and the electrooptic panel is achieved by using the connection part of the interface substrate and the plurality of electronic parts are provided on the projections that are folded toward the top-surface side of the electrooptic panel, whereby the electronic parts are opposed to the top surface of the electrooptic panel. As a result, since the interface substrate does not need to be connected to the electrooptic panel, the projections may have any dimensions so long as the electronic parts can be mounted thereon. Therefore, the dimensions of the electrooptic device do not increase. Further, where the electronic parts of the projections are opposed to the overhanging part of the top surface of the electrooptic panel, the thickness of the electrooptic device can be decreased. Accordingly, the electrooptic device can be downsized.

Further, since the electrooptic device is assembled (manufactured) by inserting the projection of the interface substrate into the cutout part, it becomes possible to prevent the projection from being damaged and the wiring of the projection from being shorted out when the electrooptic panel is housed in the case. As a result, irregular display of the image display region caused by shorting of the wiring of the projection can be reduced.

BRIEF DESCRIPTION OF THE DRAWINGS

FIGS. 3(a)–(c) illustrate an example light guide unit according to the present invention.

DETAILED DESCRIPTION

Embodiments of the present invention will now be described in detail with reference to the attached drawings. It should be noted that the present invention is not limited to these embodiments. An electrooptic device according to the present invention may be, for example, a liquid-crystal display, but is not limited thereto.

First Embodiment

Figure 1:
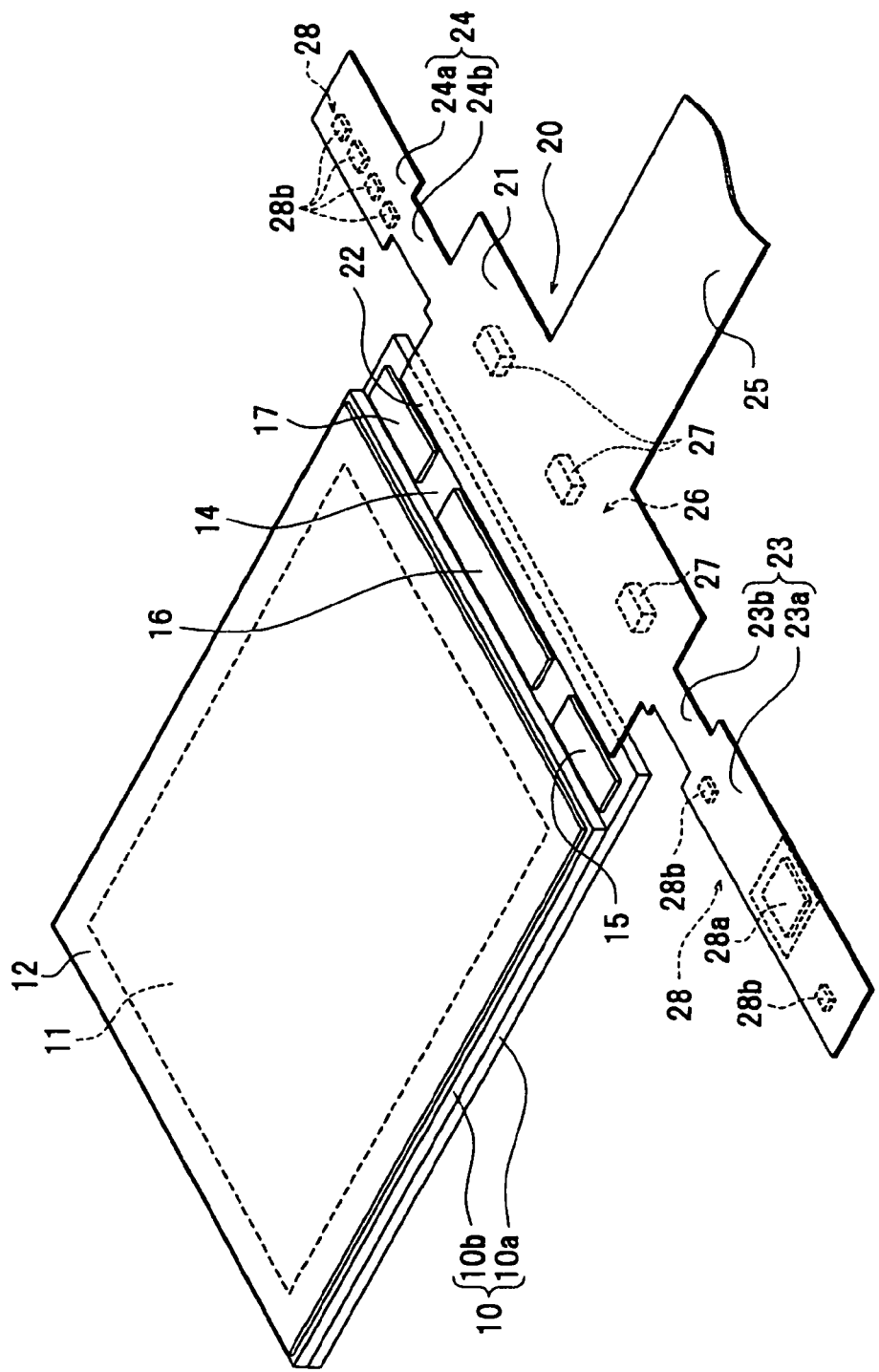
FIG. 1 illustrates an example electrooptic panel and an example interface substrate.
Figure 2A:
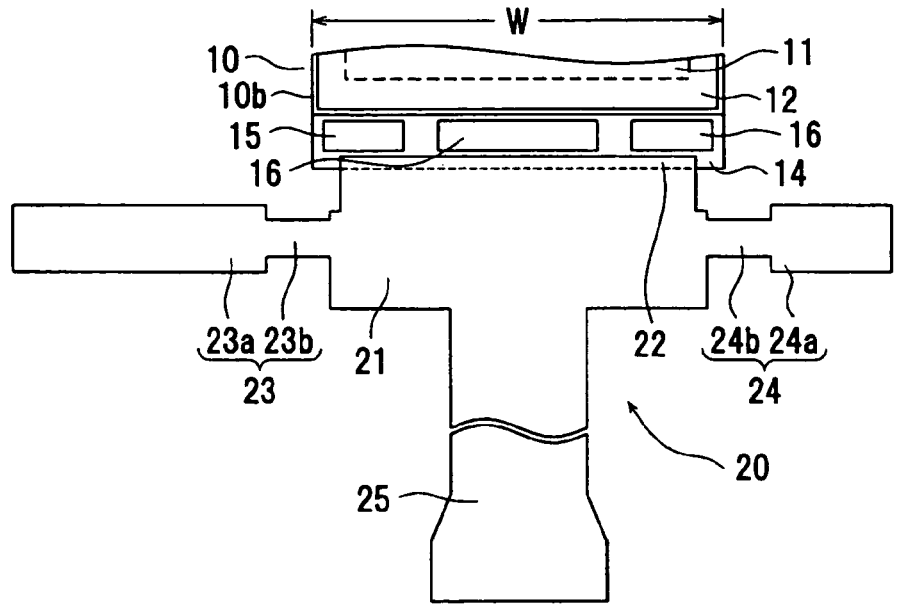
FIGS. 2(a)–(b) also illustrate the example electrooptic panel and the example interface substrate.
Figure 2B:
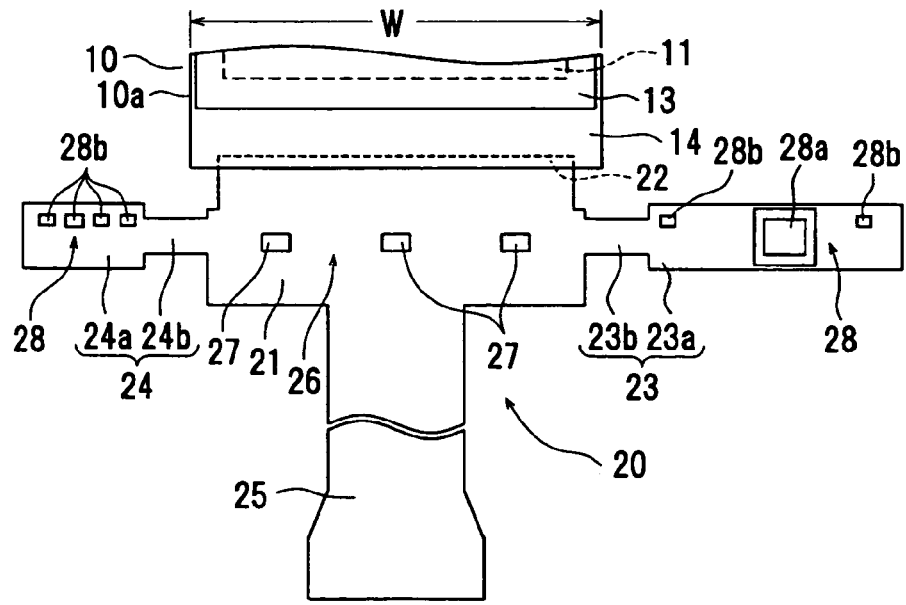

FIGS. 1 and 2 illustrate an exemplary electrooptic panel and an exemplary interface substrate. As shown in these drawings, an electrooptic panel 10 and an interface substrate 20 are mounted on an electronic apparatus such as a mobile phone. The electrooptic panel 10 is a hard substrate such as a glass substrate and has an image display region 11. This image display region 11 includes a plurality of pixels. Where the electrooptic device is a liquid-crystal display, for example, the electrooptic panel 10 has two substrates including a first electrooptic panel 10a and a second electrooptic panel 10b. A liquid crystal is filled between these two substrates by using a sealing material (not shown). Further, polarization plates 12 and 13 are provided on and under the image display region 11, so as to polarize light of LEDs 27 of a light source 26 that will be described later.

The first electrooptic panel 10a is longer than the second electrooptic panel 10b in the longitudinal direction, whereby an overhanging part 14 is formed. This overhanging part 14 has driver ICs 15 to 17 mounted thereon. The driver ICs 15 to 17 form a driver circuit for driving the image display region 11. Input terminals (not shown) of the driver ICs 15 to 17 are electrically connected to wiring of the driver ICs 15 to 17 formed on the overhanging section 14 of the electrooptic panel 10 via an AFC (Anisotropic Conductive Film). That is to say, this electrooptic device has a COG (Chip On Glass) configuration. The driver ICs 15 and 17 form a scan-signal driver circuit and the driver IC 16 forms a data-signal driver circuit.

The interface substrate 20 is a flexible substrate such as an FPC, a heat seal, and so forth. This interface substrate 20 includes a folding part 21, a connection part 22, two projections 23 and 24, and an external connection part 25. The folding part 21 is substantially rectangular-shaped and the connection part 22 is formed on its end. A plurality of LEDs (Light Emitting Diode) 27 (three LEDs are shown in FIG. 1) is mounted on the folding part 21, as the light source 26. The light source 26 is provided between a light guide plate 31 and a case 32 of a light guide unit 30 that will be described later. The LEDs 27 apply light on the light guide plate 31 of the case 32. The connection part 22 is electrically connected to the overhanging part 14 of the electrooptic panel 10. That is to say, wiring of a power IC 28a and control ICs (other electronic parts 28b) of electronic parts 28 mounted on the projections 23 and 24 that will be described later, the wiring extending to the connection part 22, is electrically connected to wiring (not shown) of the driver ICs 15 to 17 formed on the overhanging part 14 of the electrooptic panel 10 via an AFC (Anisotropic Conductive Film).

The two projections 23 and 24 project outside the width W of the electrooptic panel 10 to which the connection part 22 of the interface substrate 20 is connected. The projections 23 and 24 include band-shaped electronic-part mounting sections 23a and 24a, and band-shaped arms 23b and 24b for electrically connecting the electronic-part mounting sections 23a and 24a to the both sides of the folding part 21. A plurality of electronic parts 28 is mounted on one face of each of the electronic-part mounting sections 23a and 24a of the projections 23 and 24. The electronic parts 28 include, for example, a power-supply IC 28a for supplying a voltage to the driver ICs 15 to 17 mounted on the electrooptic panel 10 and other electronic part 28b such as a control IC for controlling the driver ICs 15 to 17 and the power-supply IC 28a, and an electronic part required for an electronic apparatus on which the electrooptic device is mounted. These electronic parts 28 are electrically connected to wiring formed on one face of each of the projections 23 and 24. This electrical connection can be achieved by using the above-described AFC. Here, the power-supply IC 28a is mounted on the projection 23. The projection part 23 is a part other than the light source 26 of the interface substrate 20, where the light source 26 is a heat-generation part. As a result, it becomes possible to reduce malfunctions in a temperature compensation circuit of the power-supply IC 28a and irregular display of the image display region 11 of the electrooptic panel 10.

The wiring of the electronic parts 28 on the projection 23 and that of the electronic parts 28 on the projection 24 extend to the folding part 21 via the arms 23b and 24b, respectively. Further, the wiring of the power-supply IC 28a and that of the control IC, which is the other electronic part 28*b*, extend to the connection part 22 of the folding part 21 and is electrically connected to the wiring of the driver ICs 15 to 17. On the other hand, the wiring of the other electronic part 28*b*, that is, the electronic part required for the electronic apparatus extends from the folding part 21 to the external connection part 25 and is electrically connected to the electronic apparatus. That is to say, the power-supply IC 28*a* that is electrically connected only to the driver ICs and the other electronic part, that is, an electronic part other than the control IC can be mounted on the projections 23 and 24.

FIG. 3 illustrates an example light guide unit according to the present invention. FIG. 3(*a*) is an exploded perspective view of the light guide unit, FIG. 3(*b*) illustrates section A—A of FIG. 3(*a*), and FIG. 3(*c*) illustrates section B—B of FIG. 3(*a*). As shown in this drawing, a light guide unit 30 includes the light guide plate 31, the case 32, a reflection sheet 33, a diffusion sheet 34, and two prism sheets 35.

This light guide unit 30 applies light from the LEDs 27 of the light source 26 of the interface substrate 20 onto the image display region 11 of the electrooptic panel 10. The light guide unit 30 and the light source 26 form an illumination device for applying light onto the image display region 11 of the electrooptic panel 10.

The light guide plate 31 is formed as a rectangular-shaped transparent synthetic resin. A plurality of retaining parts 31*a* (four retaining parts are shown in FIG. 3(*a*)) are provided on predetermined positions on both sides of the light guide plate 31. Further, two protruding parts 31*b* and 31*c* are provided on one of four sides of the light guide plate 31, so as to project therefrom. The light source 26 of the interface substrate 20 is provided between these two protruding parts 31*b* and 31*c*. Here, as shown in FIG. 3(*b*), one end (a lower end in this drawing) of a side of each of the protruding parts 31*b* and 31*c* of the light guide plate 31 is a curved face 31*d*.

The case 32 is formed as a heat-shaped plastic and includes a housing 32*a* for housing the electrooptic panel 10 and a light-guide-plate housing 32*b* for housing the light guide plate 31. A plurality of retaining holes 32*c* (Four retaining holes are shown in FIG. 3(*a*).) is formed on predetermined parts of predetermined sides of a light-guide-plate housing 32*b*, the predetermined parts corresponding to the retaining parts 31*a* of the light guide plate 31. Further, cutout parts 32*d* and 32*e* are formed, so as to be opposite to each other, on one side of the housing 32*a* and one side of the light-guide-plate housing 32*b*, as shown in FIG. 3(*c*). That is to say, the cutout parts 32*d* and 32*e* are formed on the inner-peripheral surface of the case 32. The width of each of the cutout parts 32*d* and 32*e* is longer than the thickness of the interface substrate 20.

The reflection sheet 33 is provided on the lower surface of the light guide plate 31 and reflects light emitted from the lower surface of the light guide plate 31 of light that is emitted from the light source 26 and guided to the light guide plate 31 toward the top-surface side of the light guide plate 31. The diffusion sheet 34 is provided on the top surface of the light guide plate 31 and diffuses light incident from the top surface of the light guide plate 31 so that uniform light is emitted from the surface. The two prism sheets 35 are stacked on the surface of the diffusion sheet 34 and used for increasing the brightness of light emitted from the diffusion sheet 34 and applying the light onto the image display region 11 of the electrooptic panel 10.

Reference numeral 40 indicates a light shielding plate for fixing the electrooptic panel 10 to the light guide unit 30. The light shielding plate 40 is formed as a frame-shaped synthetic resin and has a light-shielding characteristic.

A protruding part 41 extends from one of four sides of the light shielding plate 40 in a longitudinal direction of the light shielding plate 40, so as not to cover the cutout part 32*e* of the light-guide-plate housing 32*b* of the case 32. An adhesive is applied on both surfaces of the light shielding plate 40.

Figure 4:
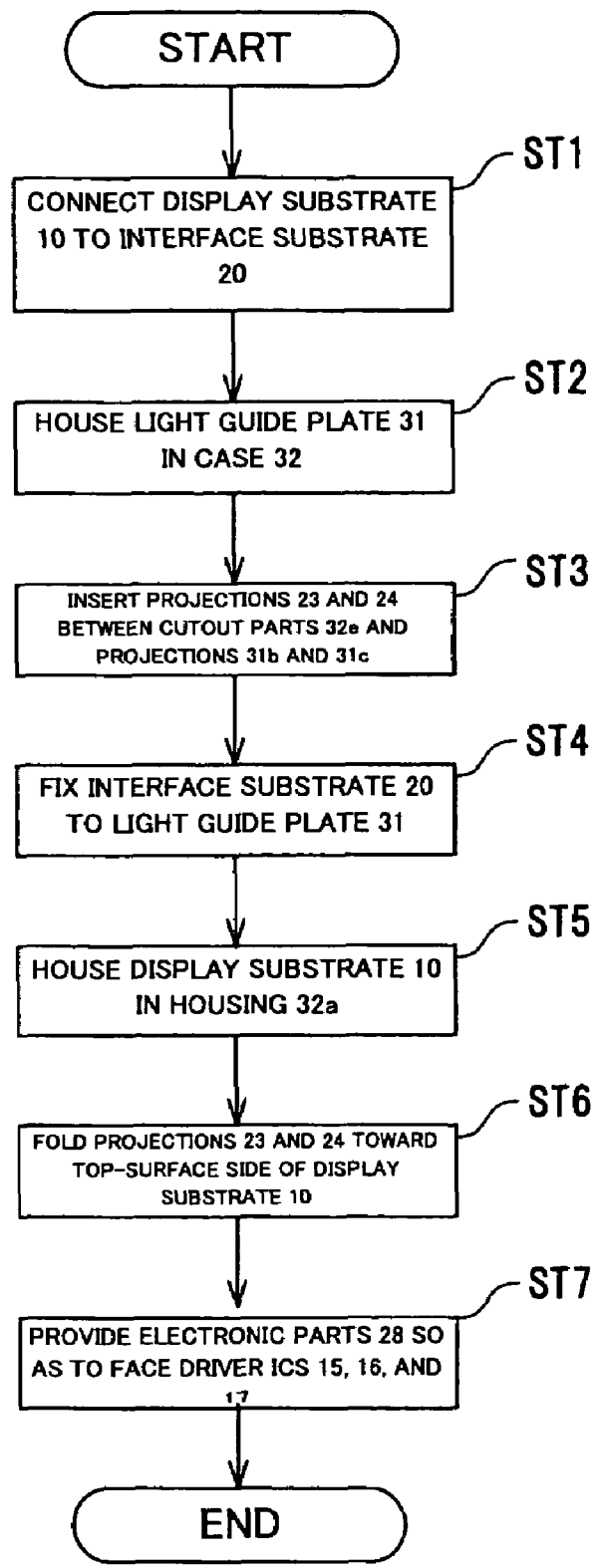
FIG. 4 shows the assembly flow of an electrooptic device according to a first embodiment.
Figure 5A:
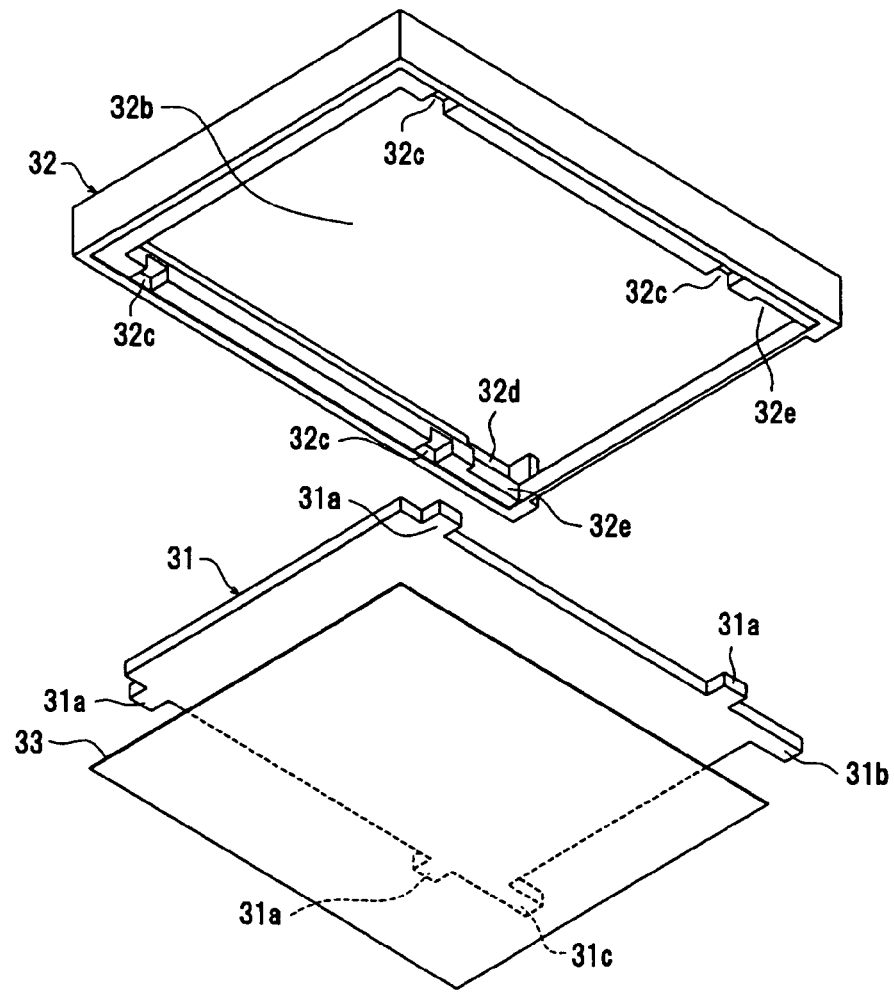
FIGS. 5(a)–(b) illustrate assembly of the electrooptic device.
Figure 5B:
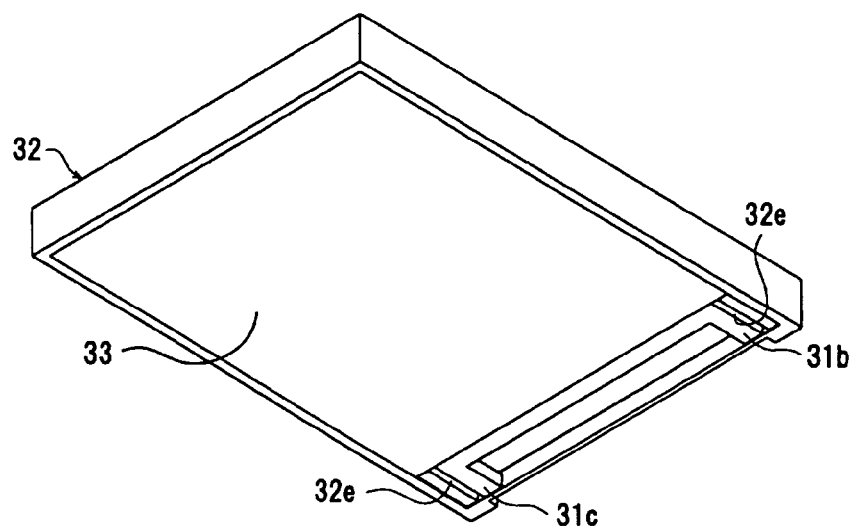
Figure 6A:
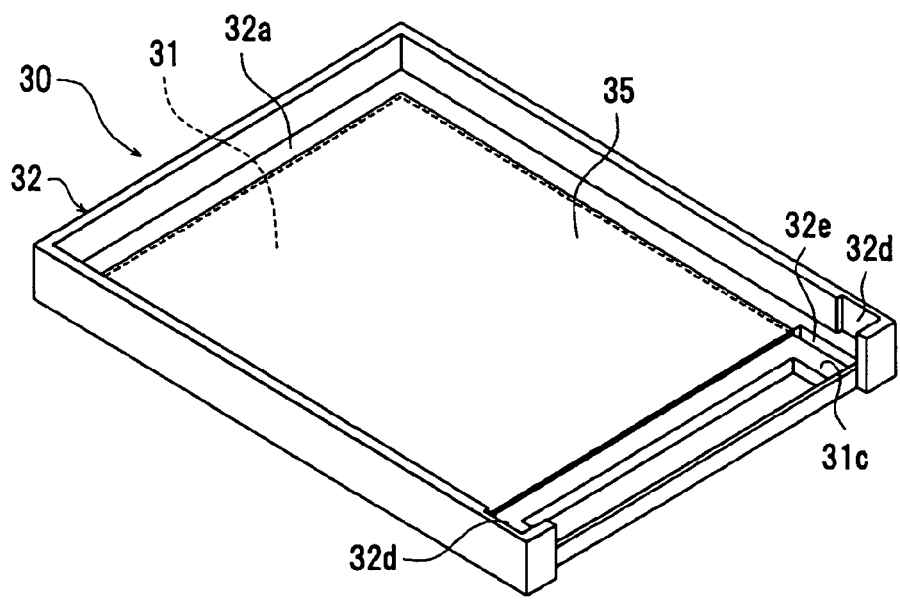
FIGS. 6(a)–(b) further illustrate the assembly of the electrooptic device.
Figure 6B:
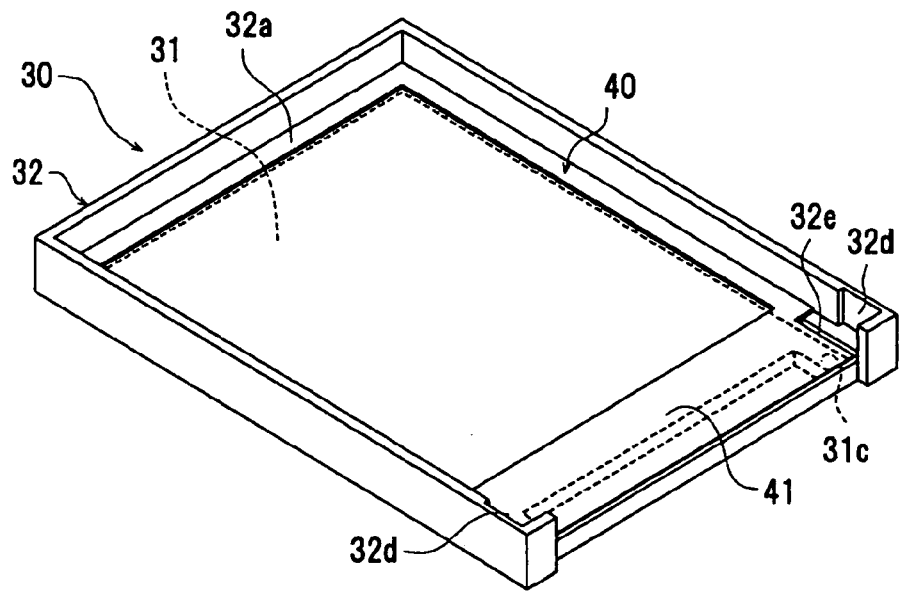

Next, a manufacturing method (assembly method) used for the electrooptic device according to the first embodiment will now be described, where the electrooptic device includes the electrooptic panel 10, the interface substrate 20, and the light guide unit 30. FIG. 4 shows the assembly flow of the electrooptic device 1 according to the first embodiment. FIGS. 5 to 9 illustrate how the electrooptic device is assembled. First, the electrooptic panel 10 and the interface substrate 20 are connected to each other (step ST1), as shown in FIG. 4. That is to say, the connection part 22 of the interface substrate 20 is electrically connected to the overhanging part 14 of the electrooptic panel 10.

Then, the light guide plate 31 is housed in the case 32 (step ST2). As shown in FIG. 5(*a*), the light guide plate 31 is housed in the light-guide-plate housing 32*b* of the case 32 from the lower side of the case 32. At this time, the retaining parts 31*a* of the light guide plate 31 are inserted into retaining holes 32*c* of the case 32 and retained. Then, the reflection sheet 33 is placed on the lower surface of the light guide plate 31, so as to cover the lower side of the case 32 housing the light guide plate 31, as shown in FIG. 5(*b*). At this time, the cutout parts 32*e* of the case 32 are exposed at the lower side of the case 32 without being blocked by the reflection sheet 33. Further, the diffusion sheet 34 and the two prism sheets 35 are sequentially provided on the top surface of the light guide plate 31 housed in the light-guide-plate housing 32*b* of the case 32, whereby the light guide unit 30 is assembled, as shown in FIG. 6(*a*). Further, the light shielding plate 40 is placed on the base of the housing 32*a* of the case 32, as shown in FIG. 6(*b*). At this time, the top surface of the light guide unit 30, that is, the top surface of the prism sheet 35 provided on the light guide plate 31 is enclosed with the light shielding plate 40. Further, the cutout parts 32*e* of the case 32 are exposed due to the protruding part 41 without being blocked by the light shielding plate 40.

Figure 7:
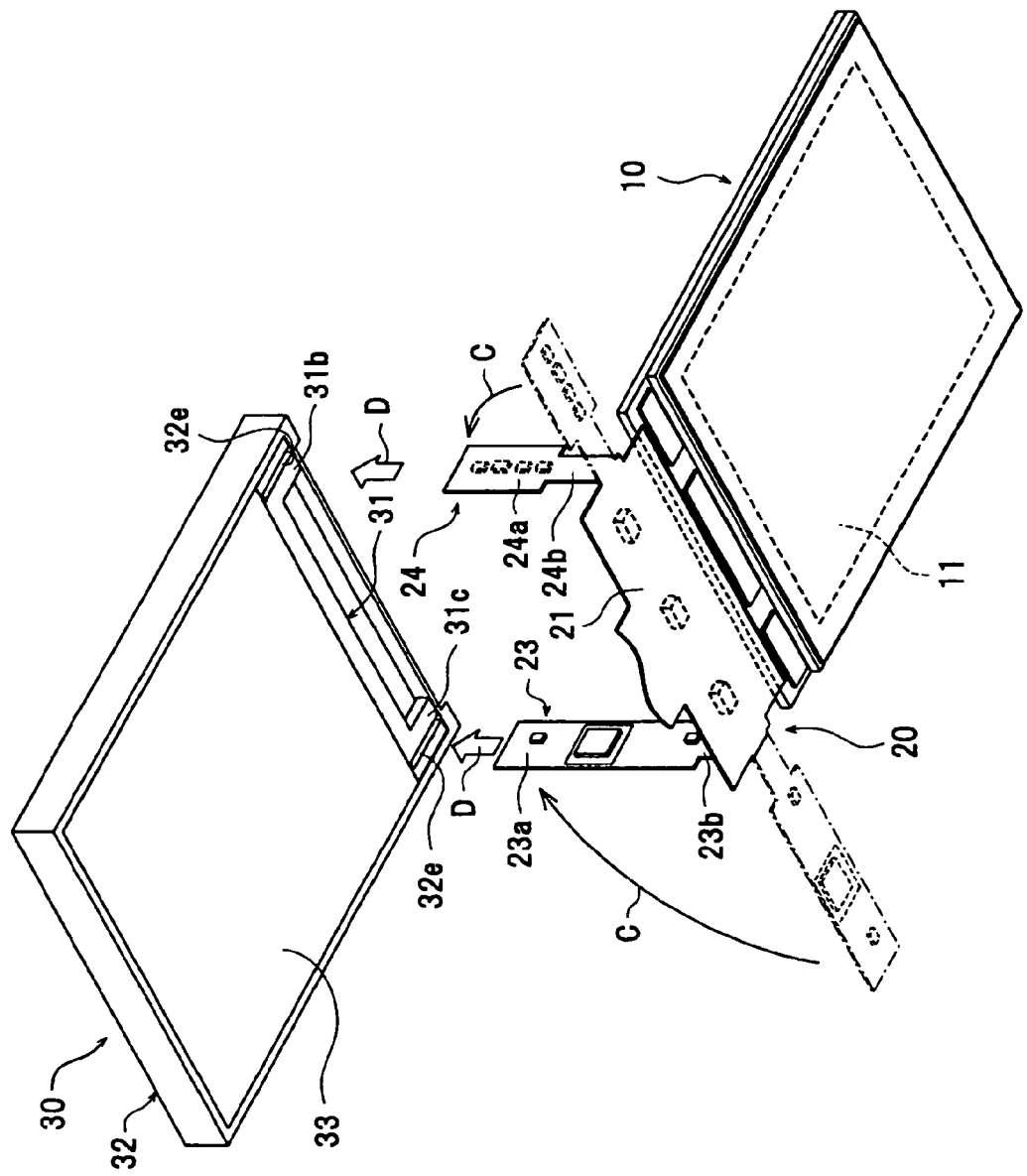
FIG. 7 further illustrates the assembly of the electrooptic device.

Then, the two projections 23 and 24 of the interface substrate 20 are inserted between the cutout parts 32*e* of the case 32 and the protruding parts 31*b* and 31*c* of the light guide plate 31, respectively (step ST3). First, the interface substrate 20 is positioned so that the lower surface of the case 32 and that of the electrooptic panel 10 are opposed to each other, as shown in FIG. 7. Then, the two projections 23 and 24 of this interface substrate 20 are folded in the direction of arrow C so that the two projections 23 and 24 are oriented in the lower side of the case 32, that is, the cutout parts 32*e* of the case 32. Then, the electrooptic panel 10 and the interface substrate 20 are moved toward the lower side of the case 32, where the projections 23 and 24 are folded, and the projections 23 and 24 are inserted between the cutout parts 32*e* of the case 32 and the protruding parts 31*b* and 31*c* of the light guide plate 31, respectively, as shown by arrows D.

Figure 8:
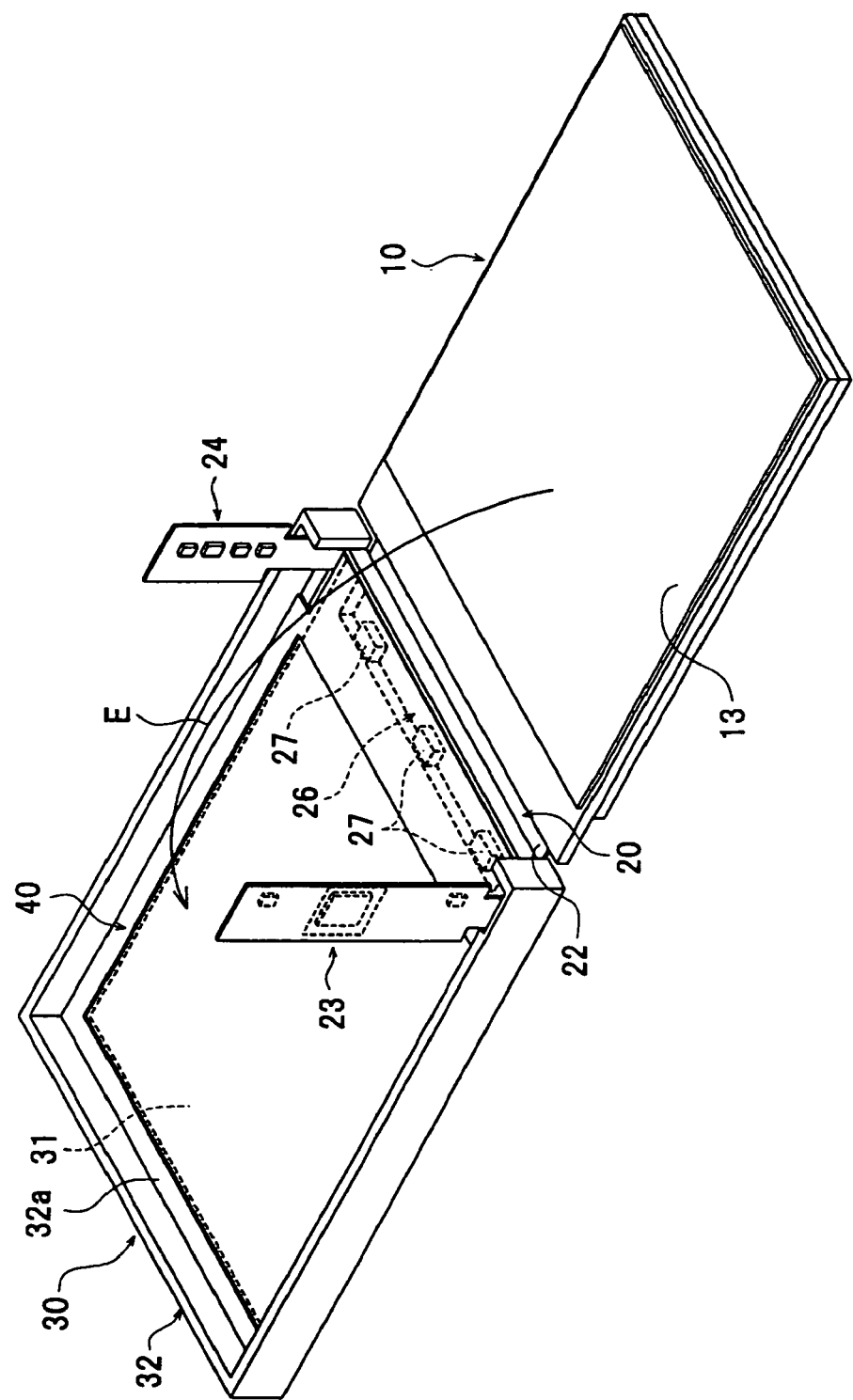
FIG. 8 further illustrates the assembly of the electrooptic device.

Then, where the projections 23 and 24 are inserted, the interface substrate 20 is fixed to the light guide plate 31 (step ST4). That is to say, the folding part 21 of the interface substrate 20 and the lower surface of the light guide plate 31 are fixed to each other by using an adhesive or a double-sided tape (not shown). Next, the electrooptic panel 10 is housed in the housing 32*a* of the case 32 (step ST5). More specifically, where the interface substrate 20 is fixed to the light guide plate 31, the electrooptic panel 10 is folded in the direction of arrow E so that it is housed in the housing 32a of the case 32, as shown in FIG. 8. At this time, the lower surface of the electrooptic panel 10 (the polarizing plate 13) is fixed by the light shielding plate 40, whereby the electrooptic panel 10 and the light guide unit 30 are integrated. Subsequently, the LEDs 27 of the light source 26 are provided between the light guide plate 31, the case 32, and the electrooptic panel 10. Here, the interface substrate 20 is folded at the connection part 22 toward the lower-surface side of the electrooptic panel 10.

Figure 9A:
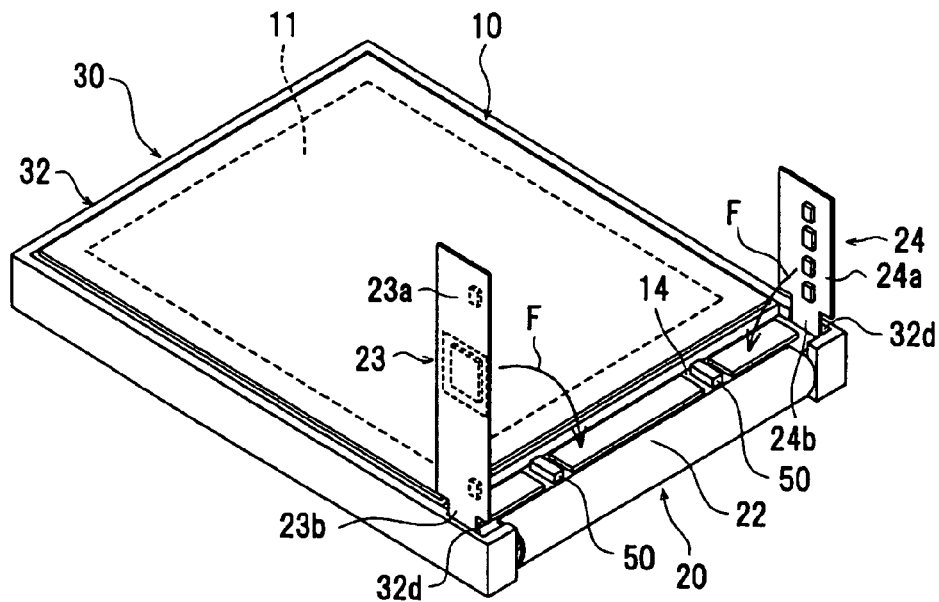
FIGS. 9(a)–(b) further illustrate the assembly of the electrooptic device.
Figure 9B:
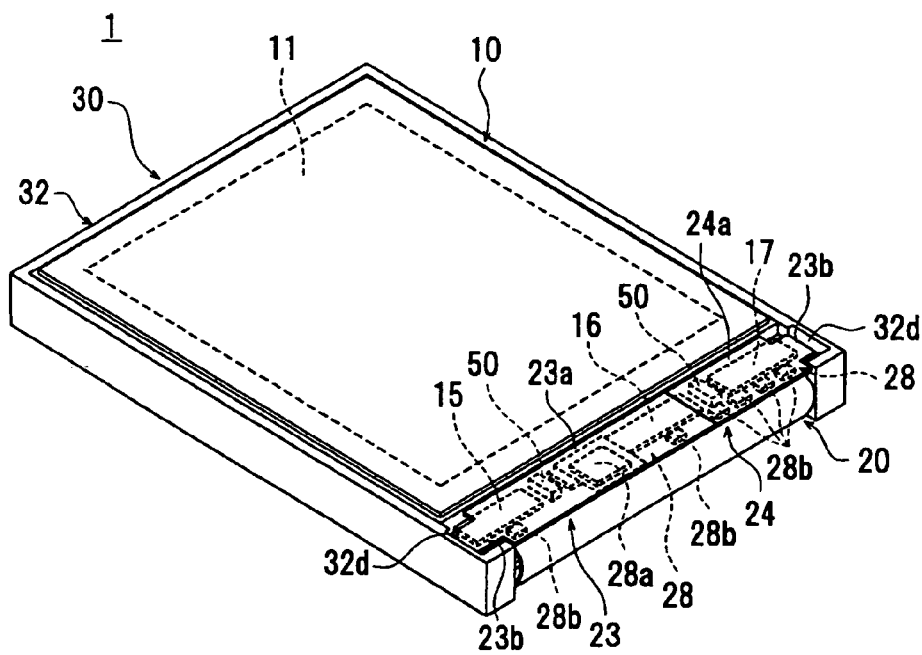

Then, the projections 23 and 24 of the interface substrate 20 are folded toward the top-surface side of the electrooptic panel 10 (step ST6). That is to say, the projections 23 and 24 exposed from the cutout parts 32d of the case 32, that is, electronic-part mounting parts 23a and 24a are folded in the direction of arrow F, as shown in FIG. 9(a). Next, the plurality of electronic parts 28 of the projections 23 and 24 are provided, so as to face the driver ICs 15 to 17 (step ST7). That is to say, the projections 23 and 24 of the interface substrate 20 are provided so as to face the top surface of the electrooptic panel 10. More specifically, one of faces of a double-sided tape 50 functioning as fixing means, the double-sided tape 50 having an insulation characteristic of a predetermined height (thickness), is fixed to the overhanging part 14 of the electrooptic panel 10 beforehand. Then, where the projections 23 and 24 are folded toward the top-surface side of the electrooptic panel 10 at the above-described step ST6, the other surface of the double-sided tape 50 is fixed to the surfaces (the surfaces on which the plurality of electronic parts 28 is mounted) of the projections 23 and 24 facing the surface of the electrooptic panel 10. Here, the height of the double-sided tape 50 is adjusted, so that the projections 23 and 24 folded toward the top-surface side of the electrooptic panel 10 are not provided above the electrooptic panel 10. Further, a gap that will be described later is formed between the plurality of electronic parts 28 and the driver ICs 15 to 17. That is to say, the gap can be easily formed between the electronic parts 28 and the driver ICs 15 to 17 by adjusting the height of the double-sided tape 50, and the positions of the projections 23 and 24 with reference to the overhanging part 14 of the electrooptic panel 10 can be easily determined. Subsequently, the manufacturing (assembly) of the electrooptic device 1 is finished.

As has been described, the interface substrate 20 is folded at the connection part 22 toward the lower-surface side of the electrooptic panel 10 and the projections 23 and 24 are folded toward the top-surface side of the electrooptic panel 10, whereby the electronic parts 28 (28a and 28b) of the projections 23 and 24 are opposed to the top-surface of the electrooptic panel 10. That is to say, the connection between the electrooptic panel 10 and the interface substrate 20 is achieved by using the connection part 22 of the interface substrate 20, and the plurality of electronic parts 28 are provided on the projections that are folded toward the top-surface side of the electrooptic panel 10, whereby the electronic parts 28 are opposed to the top surface of the electrooptic panel 10. As a result, since the electrooptic panel 10 does not need to be connected to the interface substrate 20, the projections 23 and 24 can be of any shape, so long as the plurality of electronic parts 28 is mounted thereon. Therefore, the dimensions of the electrooptic device 1 do not increase. Further, since the plurality of electronic parts 28 is opposed to the overhanging part 14 of the top-surface of the electrooptic panel 10, the plurality of electronic parts 28 can be provided on the top-surface of the electrooptic panel 10 without increasing the thickness of the electrooptic device 1. As a result, the electrooptic device 1 can be downsized.

Where the connection part 22 of the interface substrate 20 can be connected to the electrooptic panel 10, the use of the single interface substrate 20 would be adequate, even though the number of pixels or the position of the driver ICs 15 to 17 are changed. As a result, it becomes unnecessary to manufacture the interface substrate 20 for each case where the shape (the number of pixels and the position of the driver ICs 15 to 17) of the electrooptic panel 10 is changed. As a result, the number of procedures and the cost for manufacturing the electrooptic device 1 are prevented from being increased.

Further, the interface substrate 20 has the two projections 23 and 24 so as to make the plurality of electronic parts 28 face the surface of the electrooptic panel 10. As a result, the wiring of the electronic parts 28 formed on one of the projections becomes less than that of the case where the plurality of electronic parts 28 is mounted on one projection, whereby the widths and dimensions of the projections can be reduced. As a result, it becomes possible to prevent the dimensions of the projections from being increased so as to be larger than those of the overhanging part 14 on the surface of the electrooptic panel 10. Therefore, the electrooptic device 1 can further be downsized.

Figure 10A:
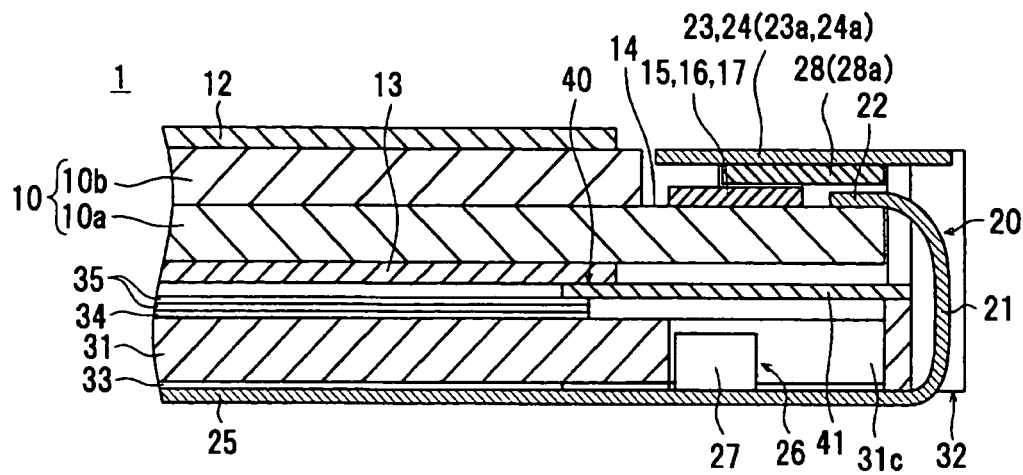
FIGS. 10(a)–(c) include sectional views of the electrooptic device according to the first embodiment.
Figure 10B:
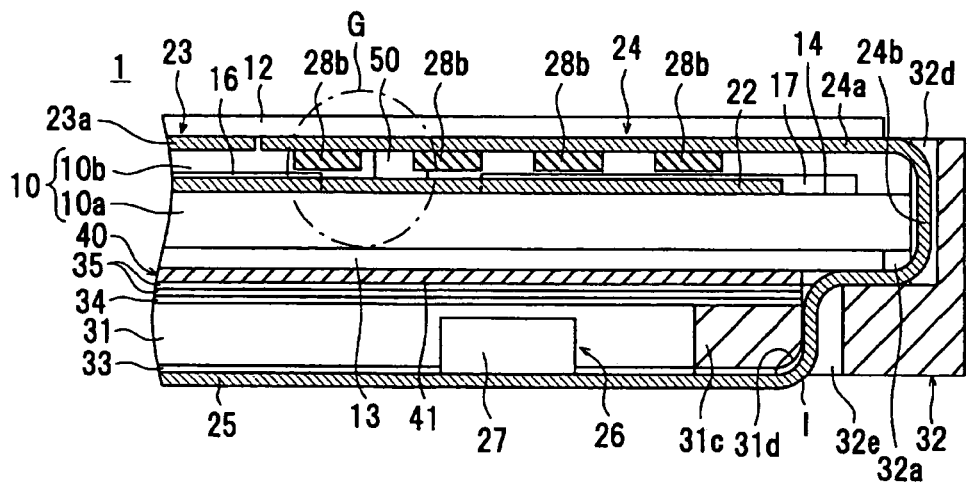
Figure 10C:
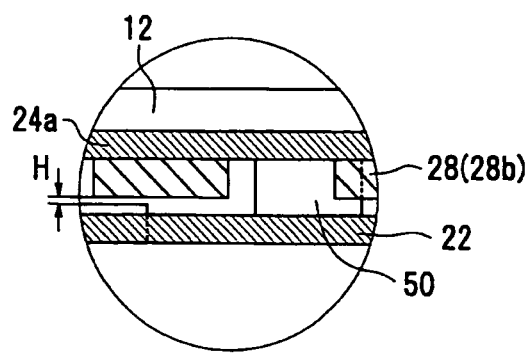

FIG. 10 is a sectional view of the electrooptic device according to the first embodiment. FIG. 10(a) is a main-part longitudinal-sectional view, FIG. 10(b) is a main-part cross-sectional view, and FIG. 10(c) is an enlarged view of G part shown in FIG. 10(b). The assembled electrooptic device 1 has arms 23b and 24b that are part of the projections 23 and 24, as shown in FIGS. 10(a) and 10(b). The arms 23b and 24b extend from the lower surface of the case 32 and between the sides of the protruding parts 31b and 31c of the light guide plate 31 and the cutout parts 32e of the case 32. The arms 23b and 24b further extend between the sides of the electrooptic panel 10 and the cutout parts 32d of the case 32. Then, the arms 23b and 24b are drawn out to the top-surface side of the electrooptic panel 10. That is to say, parts of the projections 23 and 24 are inserted into the cutout parts 32d and 32e formed on the inner-peripheral surface of the case 32, and folded toward the display side of the electrooptic panel 10. Therefore, the protrusions 23 and 24 do not protrude outside the outer-peripheral surface of the electrooptic device 1 (the case 32), whereby the electrooptic device 1 can further be downsized. Further, it becomes possible to prevent the projections 23 and 24 from being damaged and the wiring thereof from being shorted out during the electrooptic panel 10 is housed in the case 32, for example. As a result, irregular display of the image display region 11 of the electrooptic panel 10 of the electrooptic device 1 can be reduced.

Further, as shown in FIG. 10(c), the projections 23 and 24 are fixed by using the double-sided tape 50 functioning as the fixing means so that gap H is formed between the plurality of electronic parts 28 (28a and 28b) and the driver ICs 15 to 17. Therefore, this gap H reduces the shortings caused by direct contact between the plurality of electronic parts 28 and the driver ICs 15 to 17. Further, since this double-sided tape 50 has an insulating characteristic, it can reduce shortings caused by electrical contact between the wiring of the plurality of electronic parts 28 formed on the projections 23 and 24 and that of the driver ICs 15 to 17 formed on the overhanging part 14 that is the top surface of the electrooptic panel 10. As a result, irregular display of the image display region 11 of the electrooptic panel 10 of the electrooptic device 1 can be reduced.

Further, as shown in FIG. 10(b), an end of the side of each of the protruding parts 31b and 31c of the light guide plate 31, the protruding parts 31b and 31c being opposed to the cutout parts 32e of the case 32, is formed as the curved face 31d. Therefore, folding parts I used for folding the projections 23 and 24 toward the top-surface side of the electrooptic panel 10 are folded along the curved faces 31d. That is to say, the folding parts I of the projections 23 and 24 are prevented from being bulged outward from the lower surface of the electrooptic device 1 (the case 32). Since the projections 23 and 24 do not project outward from the lower surface of the electrooptic device 1 (the lower surface of the case 32), the electrooptic device 1 can further be downsized.

Second Embodiment

FIG. 11 illustrates another example case according to the present invention. FIG. 12 illustrates an example electrooptic device according to a second embodiment. An electrooptic device 1' shown in FIG. 12 is different from the electrooptic device 1 shown in FIG. 9(b) in that the projections 23 and 24 are folded toward the top-surface side of the electrooptic panel 10 via cutout parts 32f provided on the outer-peripheral surface of a case 32'. Further, the basic configuration of the electrooptic device 1' except the electrooptic panel 10, the interface substrate 20, and the case 32' of the light guide unit 30 is substantially the same as that of the electrooptic device 1 shown in FIG. 9(b). Therefore, the description of the electrooptic device 1' is omitted. Here, the electrooptic device 1' has the COG configuration, as is the case with the electrooptic device 1 shown in FIG. 9(b).

Figures 11A, 11B, 11C:
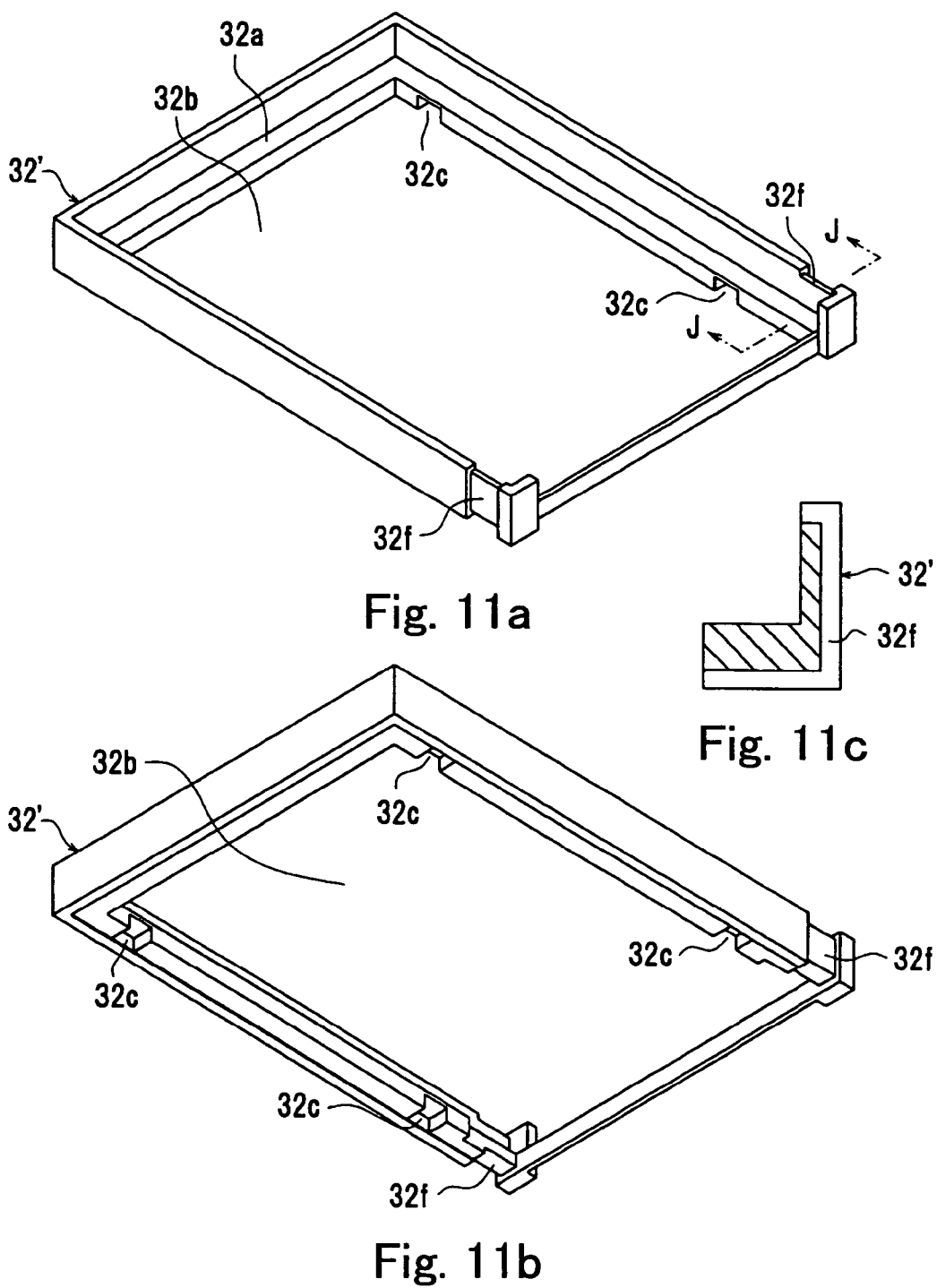
FIGS. 11(a)–(c) show another example case according to the present invention.

The case 32' is formed as a heat-shaped plastic and includes the housing 32a for housing the electrooptic panel 10 and the light-guide-plate housing 32b for housing the light guide plate 31, as shown in FIG. 11. The plurality of retaining holes 32c (Four retaining holes are shown in this drawing) is formed on predetermined sides of the light-guide-plate housing 32b at predetermined positions corresponding to the retaining parts 31a of the light guide plate 31. Further, the cutout parts 32f are formed, so as to be opposite to each other, on the outer-peripheral surface of the case 32, as shown in FIG. 11(c). The width of each of the cutout parts 32f is longer than the thickness of the interface substrate 20.

Figure 13:
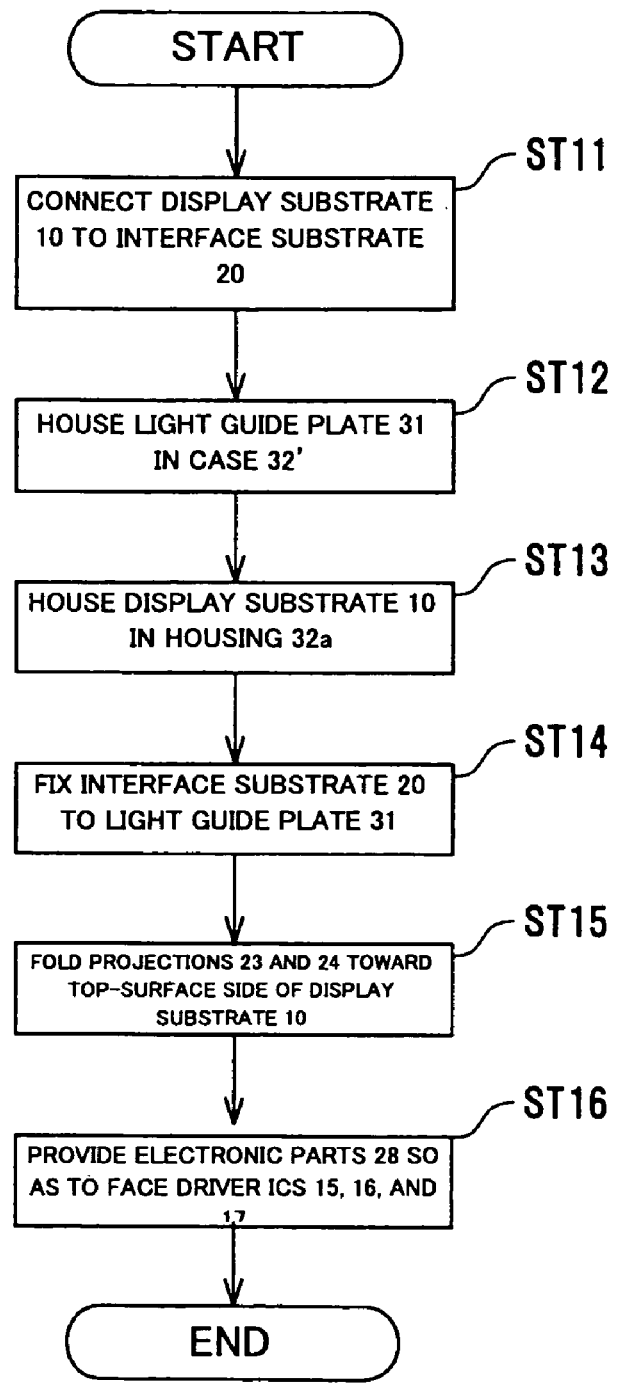
FIG. 13 shows the assembly flow of the electrooptic device according to the second embodiment.

Next, a manufacturing method (an assembly method) for the electrooptic device 1' will be described. FIG. 13 illustrates the assembly flow of the electrooptic device 1'. First, as shown in FIG. 13, the electrooptic panel 10 and the interface substrate 20 are connected to each other (step ST11), as shown in FIG. 13. That is to say, the connection part 22 of the interface substrate 20 is electrically connected to the overhanging part 14 of the electrooptic panel 10. Then, the light guide plate 31 is housed in the case 32' (step ST12). That is to say, the light guide plate 31 is housed in the light-guide-plate housing 32b of the case 32' from the lower side of the case 32' (refer to FIG. 5(a)). At this time, the retaining parts 31a of the light guide plate 31 are inserted into the retaining holes 32c of the case 32' and retained. Then, the reflection sheet 33 is placed on the lower surface of the light guide plate 31, so as to cover the lower surface of the case 32' housing the light guide plate 31 (refer to FIG. 5(b)). Further, the diffusion sheet 34 and the two prism sheets 35 are sequentially provided on the top surface of the light guide plate 31 housed in the light-guide-plate housing 32b of the case 32', whereby the light guide unit 30 is assembled (refer to FIG. 6(a)). Further, the light shielding plate 40 is placed on the base of the housing 32a of the case 32' (refer to FIG. 6(b)).

Next, the electrooptic panel 10 is housed in the housing 32a of the case 32' (step ST13). That is to say, the lower surface (the polarizing plate 13) of the electrooptic panel 10 is fixed by the above-described light shielding plate 40, whereby the electrooptic panel 10 and the light guide unit 30 are integrated with each other. Subsequently, the LEDs 27 of the light source 26 are provided between the light guide plate 31, the case 32', and the electrooptic panel 10. Then, the interface substrate 20 is fixed to the light guide plate 31, where the electrooptic panel 10 is housed in the housing 32a of the case 32' (step ST14). That is to say, the interface substrate 20 is folded at the connection part 22 toward the lower-surface side of the electrooptic panel 10, and the folding part 21 of the interface substrate 20 and the lower surface of the light guide plate 31 are fixed to each other by using an adhesive or a double-sided tape (not shown).

Figure 12A:
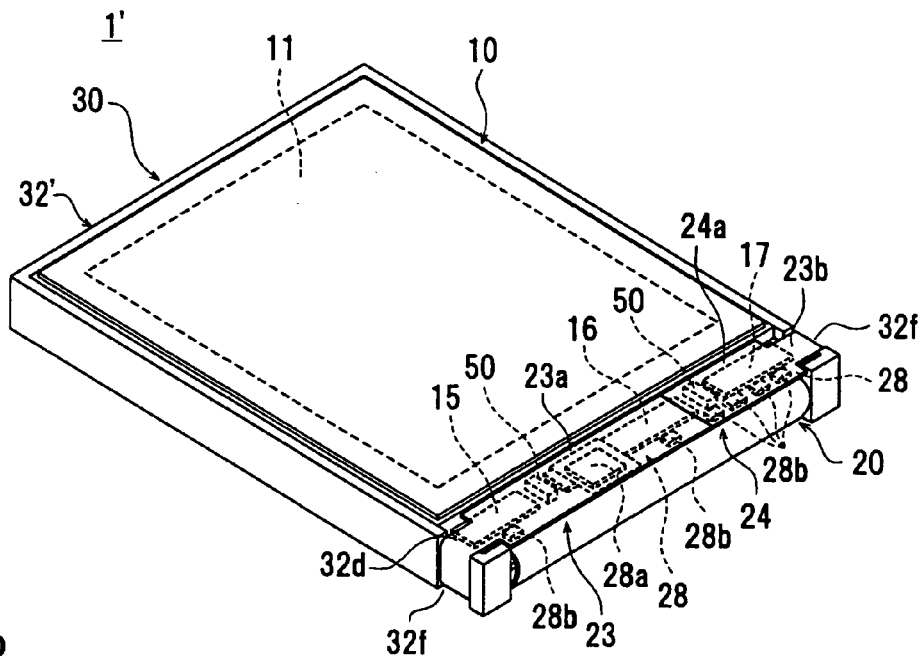
FIGS. 12(a)–(b) illustrate an example electrooptic device according to a second embodiment.

Then, the projections 23 and 24 of the interface substrate 20 are folded toward the top-surface side of the electrooptic panel 10 (step ST15). That is to say, the projections 23 and 24 are folded from the outer-peripheral surface of the case 32' toward the top-surface side of the optoelectronic panel 10, as shown in FIG. 12(a). Here, predetermined parts of the projections 23 and 24 are inserted into the cutout parts 32f provided on the outer-peripheral surface of the case 32'. Next, the plurality of electronic parts 28 of the projections 23 and 24 are provided, so as to be opposed to the driver ICs 15 to 17 (step ST16). That is to say, the projections 23 and 24 of the interface substrate 20 are provided, so as to be opposed to the top surface of the electrooptic panel 10. This configuration is achieved by fixing the overhanging part 14 of the top surface of the electrooptic panel 10 to the surfaces of the projections 23 and 24 (the surfaces on which the plurality of electronic parts 28 are mounted), the surfaces facing the surface of the electrooptic panel 10, by using the double-sided tape 50 functioning as the fixing means, as shown in this drawing. Subsequently, the manufacturing (assembly) of the electrooptic device 1' is finished.

As has been described, the interface substrate 20 is folded at the connection part 22 toward the lower-surface side of the electrooptic panel 10 and the projections 23 and 24 are folded toward the top-surface side of the electrooptic panel 10, whereby the electronic parts 28 (28a and 28b) of the projections 23 and 24 are opposed to the surface of the electrooptic panel 10. That is to say, the connection between the electrooptic panel 10 and the interface substrate 20 is achieved by using the connection part 22 of the interface substrate 20, and the plurality of electronic parts 28 are provided on the projections that are folded toward the top-surface side of the electrooptic panel 10, whereby the electronic parts 28 are opposed to the top surface of the electrooptic panel 10. As a result, since the electrooptic panel 10 does not need to be connected to the interface substrate 20, the projections 23 and 24 may be of any shape, as long as the plurality of electronic parts 28 can be mounted thereon. Therefore, the dimensions of the electrooptic device 1' do not increase. Further, since the plurality of electronic parts 28 are opposed to the overhanging part 14 of the top surface of the electrooptic panel 10, it becomes possible to provide the plurality of electronic parts 28 on the top surface of the electrooptic panel 10 without increasing the thickness of the electrooptic device 1'. As a result, the electrooptic device 1' can be downsized.

Figure 12B:
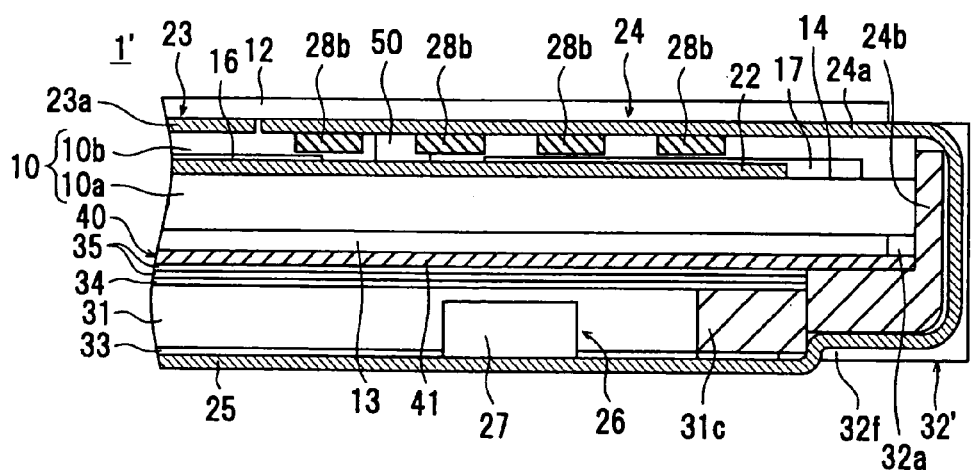

Further, as shown in FIG. 12(b), the arms 23b and 24b that are parts of the projections 23 and 24 extend from the lower surface of the case 32', go through the cutout parts 32f of the case 32', and are drawn out to the top-surface side of the electrooptic panel 10. That is to say, parts of the projections 23 and 24 are inserted into the cutout parts 32f formed on the outer-peripheral surface of the case 32', and folded toward the display side of the electrooptic panel 10. Therefore, the protrusions 23 and 24 do not protrude outside the outer-peripheral surface of the electrooptic device 1' (the case 32'), whereby the electrooptic device 1' can further be downsized.

The plurality of electronic parts 28 of the above-described embodiment can be covered by an insulator layer. In this case, the electronic parts 28 of the projections 23 and 24 are prevented from being electrically contacted with the wiring on the top surface of the electrooptic panel 10 and the driver ICs 15 to 17.

As a result, it becomes possible to prevent the electronic parts 28 of the projections 23 and 24, the wiring on the surface of the electrooptic panel 10, and the driver ICs 15 to 17 from being shorted out. Further, irregular display of the image display region 11 of the electrooptic panel 10 is reduced.

In the above-described embodiment, the double-sided tape is used as the fixing means for fixing the projections 23 and 24 to the top surface of the electrooptic panel 10. However, another means can be used where the gap H is formed between the electronic parts 28 of the projections 23 and 24, and the driver ICs 15 to 17 of the electrooptic panel 10. For example, the electronic parts 28 of the projections 23 and 24 may be fixed to the driver ICs 15 to 17 of the electrooptic panel 10 by using an insulating adhesive so that the projections 23 and 24 are fixed to the top surface of the electrooptic panel 10. In this case, the insulating adhesive provided between the electronic parts 28 and the driver ICs 15 to 17 functions as a gap, whereby the electronic parts 28 and the driver ICs 15 to 17 are prevented from being directly contacted with each other. As a result, it becomes possible to reduce irregular display of the image display region caused by shortings of the electronic parts 28, or the driver ICs 15 to 17.

In the case where the projections 23 and 24 are prevented from being moved to the other side of the top surface of the electrooptic panel 10 through the use of a metal frame for holding the electrooptic devices 1 and 1', a gap may be provided between the electronic parts 28 of the projections 23 and 24, and the driver ICs 15 to 17 of the electrooptic panel 10. Further, the gap may be formed between the electronic parts 28 of the projections 23 and 24, and the driver ICs 15 to 17 of the electrooptic panel 10 by forming a T-shaped retaining piece, for example, on one of the projections 23 and 24, and a retaining hole on the other. This retaining piece is inserted into the retaining hole so that the projections 23 and 24 are retained to each other.

Figure 14A:
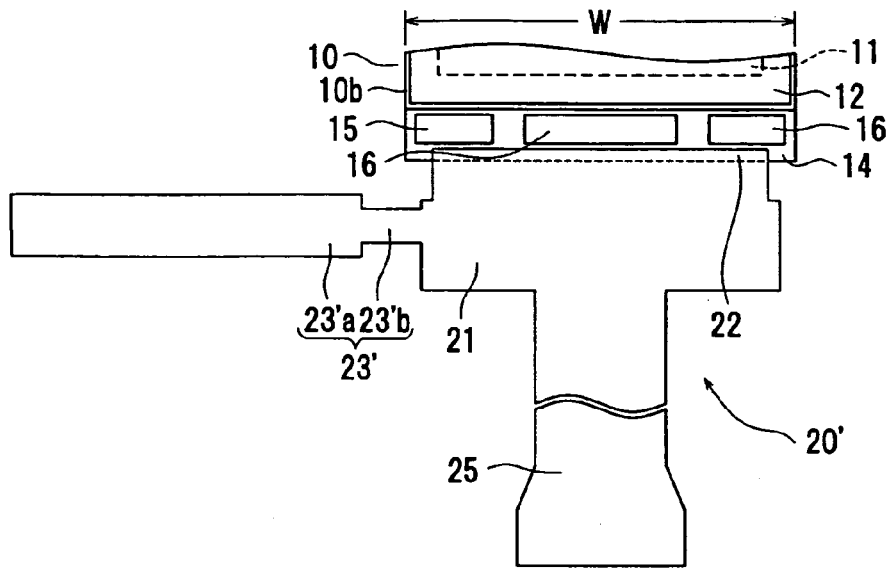
FIGS. 14(a)–(b) show another example interface substrate.
Figure 14B:
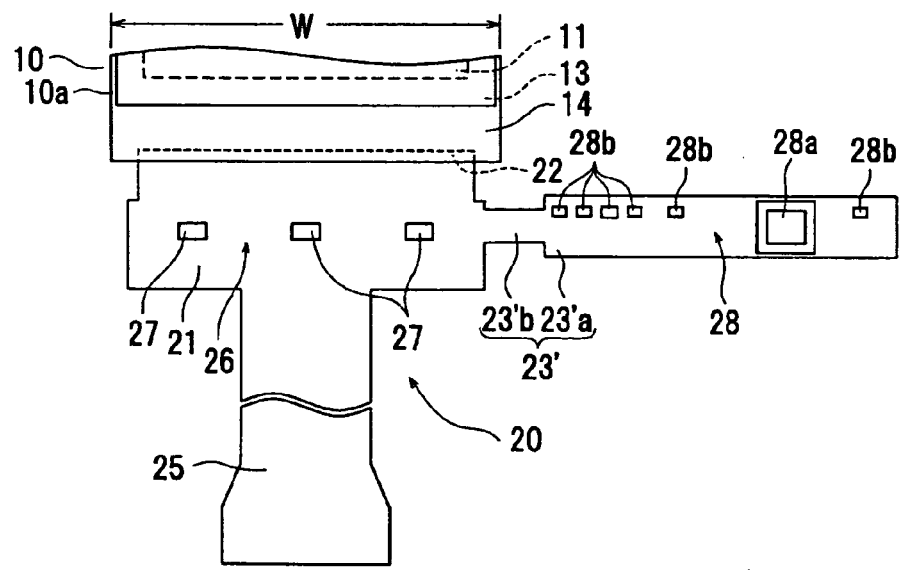
Figure 15A:
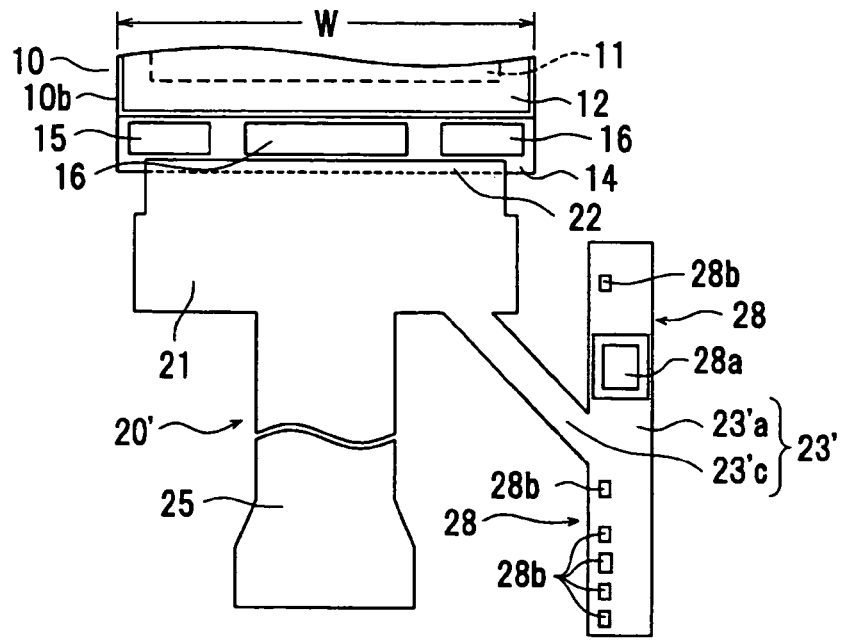
FIGS. 15(a)–(b) show another example interface substrate.
Figure 15B:
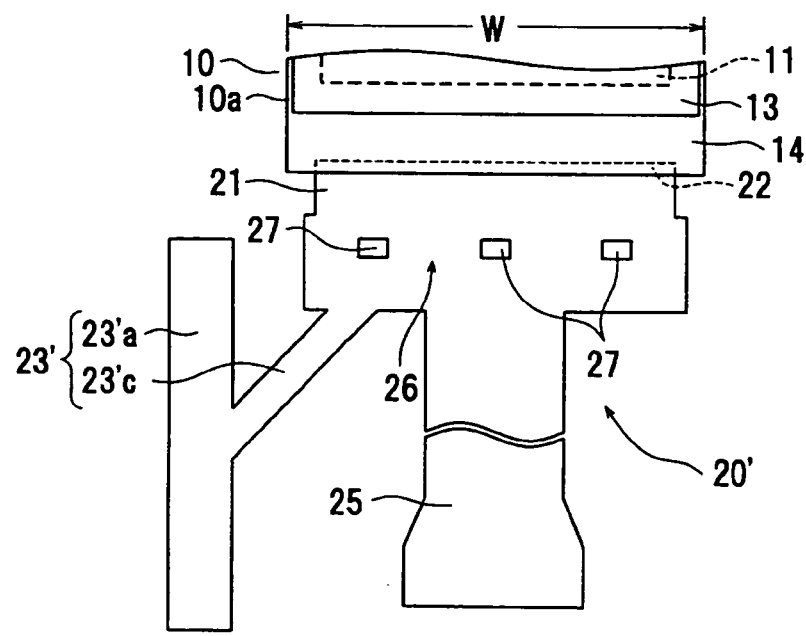

According to the above-described embodiment, the projections 23 and 24 of the interface substrate 20 project from both sides of the holding part 21 of the interface substrate 20. However, the present invention is not limited to the above-described configuration. FIGS. 14 and 15 illustrate other example interface substrates. As shown in FIG. 14, a projection 23' may project from one of sides of the folding part 21 of an interface substrate 20'. In this case, length L of the projection 23' may preferably be determined so that the entire electronic parts 28 can be provided on the projections 23'. The projections 23 and 23', and 24 only have to project outward from the width W of the electrooptic panel 10 to which the connection part 22 of the interface substrates 20 or 20' is connected. Further, an electronic-part mounting part 23'a of the projection 23' may be connected to an arm 23'c projecting from the folding part 21 of the interface substrate 20' in a direction with a predetermined inclination, as shown in FIG. 15. In this case, the interface substrate 20' is folded at the connection part 22 toward the lower-surface side of the electrooptic panel 10, and the arm 23'c is folded back along the folding part 21 of the folded interface substrate 20'. Subsequently, the projection 23' is folded toward the top-surface side of the electrooptic panel 10, so that the plurality of electronic parts 28 of the projection 23' is opposed to the surface of the electrooptic panel 10.

Although the electrooptic device having the COG configuration has been described, as the electrooptic devices 1 and 1', the present invention is not limited to the above-described embodiments, and can be used for an electrooptic device having a COF (Chip On FPC) configuration, wherein the driver ICs 15 to 17 are mounted on the interface substrate 20.

Further, the liquid-crystal display has been described in the above-described embodiments, as the electrooptic devices 1 and 1'. However, the present invention is not limited to the above-described embodiments, and can be used for an electrophoretic device, for example. That is to say, the present invention can be used for various electrooptic devices using externally applied light.

Application of the Present Invention

An electronic apparatus having the electrooptic device 1 or 1' of the present invention mounted thereon may be, among others, a mobile phone, or an apparatus using the electrooptic device, where the apparatus includes, for example, a mobile information apparatus referred to as a PDA (Personal Digital Assistants), a mobile personal computer, a personal computer, a digital still camera, an on-vehicle monitor, a digital video camera, a liquid-crystal television, a video tape recorder of view-finder type or monitor-direct-view type, a car navigation system, a pager, an electronic personal organizer, an electronic calculator, a word processor, a work station, a video phone, a POS terminal, and so forth.

The electrooptic devices 1 and 1' of the present invention may be either a semi-transmission liquid-crystal display device or a liquid-crystal display device of full-transmission type or full-reflection type. Where the full-reflection-type liquid crystal display is used, the light source 26 and the light guide unit 30 of the interface substrate 20 for applying light onto the image display region 11 of the electrooptic panel 10 may not be provided.

The sounder-equipped electrooptic devices 1 and 1' of the present invention may be a active-matrix-type liquid-crystal display (e.g., a liquid-crystal display having a thin-film transistor (TFT), or a thin-film diode (TFD) functioning as a switching element) or a passive-matrix liquid-crystal display. Further, the electrooptic devices 1 and 1' of the present invention are not limited to the liquid-crystal display, but may be an electro-luminescence device, a plasma display device, a field-emission display device, an LED (light emitting diode) display device, an electrophoretic display device, and so forth. Further, where a self-luminous electrooptic device is used, the light source 26 and the light guide unit 30 of the interface substrate 20 for applying light onto the image display region 11 of the electrooptic panel 10 may not be provided.

What is claimed is:

1. An electrooptic device comprising:
  an electrooptic panel having an image display region for displaying an image; and
  an interface substrate connected to the electrooptic panel via a connection part, wherein the interface substrate has a folding part folded at the connection part toward a lower-surface side of the electrooptic panel and projections extending from the folding part positioned at the lower-surface side of the electrooptic panel, and wherein the projections are folded toward a top-surface side of the electrooptic panel so that electronic parts of the projections are opposed to the top surface of the electrooptic panel.

2. An electrooptic device according to claim 1, wherein the electrooptic panel has a driver IC mounted thereon for controlling image display of the image display region, and
wherein the projections are provided so as to face the driver IC.

3. An electrooptic device according to claim 1, wherein the projections are provided on both sides of the interface substrate.

4. An electrooptic device according to claim 1, wherein the electronic parts include a power-supply IC for applying power at least to the image display region of the electrooptic panel.

5. An electrooptic device according to claim 1, wherein the electronic parts are covered by an insulator layer.

6. An electrooptic device according to claim 1, wherein the electrooptic panel includes a pair of substrates with different dimensions and includes an overhanging part formed by the pair of substrates, and
wherein the projections are provided so as to face the overhanging part.

7. An electrooptic device according to claim 6, wherein the driver IC is mounted on the overhanging part of the electrooptic panel, and
wherein the projections are fixed by fixing means so that a gap is provided between the electronic parts and the driver IC.

8. An electrooptic device according to claim 7, wherein the fixing means comprises a double-sided tape having an insulation characteristic provided between opposing surfaces of the projections and the overhanging part.

9. An electrooptic device according to claim 7, wherein the fixing means comprises an adhesive having an insulation characteristic for fixing the electronic parts to the driver IC.

10. An electrooptic device according to claim 1, further comprising a case having a housing for housing the electrooptic panel,
wherein a cutout part where part of the projection folded toward the top-surface side of the electrooptic panel is placed is provided on an inner-peripheral surface of the case.

11. An electrooptic device according to claim 10, further comprising:
a light source provided on one of surfaces of the interface substrate, and
a light guide plate that is housed in the case and that receives light applied from the light source and emits the applied light onto the image display region,
wherein one end of a side face of the light guide plate has a curved face, the one end being opposed to the cutout part.

12. An electrooptic device according to claim 1, further comprising:
a case having a housing for housing the electrooptic panel,
wherein a cutout part where part of the projection folded toward the top-surface side of the electrooptic panel is placed is provided on an outer-peripheral surface of the case.

13. An electronic apparatus including an electrooptic device according to claim 1.

14. A method for manufacturing an electrooptic device, the method comprising the steps of:
connecting an electrooptic panel having an image display region for displaying an image to a connection part of an interface substrate,
folding a folding part of the interface substrate at the connection part toward a lower-surface side of the electrooptic panel, and
folding projections extending from the folding part of the interface substrate toward a top-surface side of the electrooptic panel, so that electronic parts of the projections are opposed to the top surface of the electrooptic panel.

15. A method for manufacturing an electrooptic device, the method comprising the steps of:
connecting an electrooptic panel having an image display region for displaying an image to a connection part of an interface substrate having a light source mounted thereon,
housing a light guide plate in a case,
inserting a projection extending from a folding part of the interface substrate between a cutout part provided on an inner-peripheral surface of the case and the light guide plate,
fixing the interface substrate to the light guide plate so that light emitted from the light source is incident on the light guide plate,
housing the electrooptic panel in a housing formed in the case by folding the electrooptic panel at the folding part,
folding the projection toward a top-surface side of the electrooptic panel, and
providing electronic parts of the projection so as to be opposed to the top surface of the electrooptic panel.

16. An electrooptic device comprising:
an electrooptic panel having an image display region for displaying an image; and
an interface substrate connected to the electrooptic panel via a connection part,
wherein the interface substrate has a folding part folded at the connection part toward a lower-surface side of the electrooptic panel and projections extending from the folding part positioned at the lower-surface side of the electrooptic panel, and wherein the projections are folded toward the lower-surface side of the electrooptic panel so that electronic parts of the projections are opposed to the lower surface of the electrooptic panel.

* * * * *